(12) United States Patent
Frank et al.

(10) Patent No.: US 7,137,088 B2
(45) Date of Patent: Nov. 14, 2006

(54) SYSTEM AND METHOD FOR DETERMINING SIGNAL COUPLING COEFFICIENTS FOR LINES

(75) Inventors: Mark D. Frank, Longmont, CO (US); Jerimy Nelson, Fort Collins, CO (US); Kari Bois, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 153 days.

(21) Appl. No.: 10/838,905

(22) Filed: May 4, 2004

(65) Prior Publication Data

US 2005/0251770 A1 Nov. 10, 2005

(51) Int. Cl.
G06F 17/50 (2006.01)

(52) U.S. Cl. .................. 716/5; 716/4; 716/6; 716/8; 716/10

(58) Field of Classification Search .............. 716/5, 716/4, 6, 8, 10
See application file for complete search history.

(56) References Cited

U.S. PATENT DOCUMENTS

| | | | |
|---|---|---|---|
| 5,459,673 | A | 10/1995 | Carmean et al. |
| 5,519,633 | A | 5/1996 | Chang et al. |
| 5,546,321 | A | 8/1996 | Chang et al. |
| 5,572,611 | A | 11/1996 | Jinguji et al. |
| 5,610,833 | A | 3/1997 | Chang et al. |
| 5,761,080 | A | 6/1998 | DeCamp et al. |
| 6,128,768 | A | 10/2000 | Ho |
| 6,286,126 | B1 | 9/2001 | Raghavan et al. |
| 6,327,542 | B1 | 12/2001 | McBride |
| 6,421,814 | B1 | 7/2002 | Ho |
| 6,438,729 | B1 | 8/2002 | Ho |
| 6,507,807 | B1 | 1/2003 | McBride |
| 6,516,456 | B1 | 2/2003 | Garnett et al. |
| 6,539,527 | B1 | 3/2003 | Naffziger et al. |
| 6,587,997 | B1 | 7/2003 | Chen et al. |
| 6,675,118 | B1 | 1/2004 | Wanek et al. |
| 6,701,289 | B1 | 3/2004 | Garnett et al. |
| 2003/0057966 | A1 | 3/2003 | Kenji et al. |
| 2003/0200517 | A1 | 10/2003 | Jones |
| 2003/0237063 | A1 | 12/2003 | Kauth et al. |

FOREIGN PATENT DOCUMENTS

| | | |
|---|---|---|
| EP | 455372 | 11/1991 |
| EP | 597087 | 5/1994 |
| EP | 629896 A2 | 12/1994 |
| EP | 646884 | 4/1995 |
| EP | 992806 | 4/2000 |
| EP | 629896 B1 | 10/2001 |
| WO | WO 9324896 | 12/1993 |
| WO | WO 02003266 | 1/2002 |

OTHER PUBLICATIONS

Birchak et al.,"Chracteristic Impedance and Coupling Coefficient for Multilayer PC boards", Sep. 1988, IEEE International Test Conference, Proceddings pp. 28-38.*

(Continued)

*Primary Examiner*—Sun James Lin

(57) ABSTRACT

Systems and methods for determining a signal coupling coefficient for a line or trace in an electrical circuit layout are disclosed. The systems and methods include, for example, reading a threshold value for a signal coupling coefficient, identifying the line in a circuit design database, establishing a window around the line in which circuit elements will be included in a calculation of the signal coupling coefficient of the line, calculating a signal coupling coefficient of the line based upon the circuit elements in the window, flagging the line if the calculated coupling coefficient differs from the threshold value, flagging the target line with a design rule check if the threshold value exceeds the calculated coefficient and storing the design rule check in the circuit design database. Systems and methods for determining signal coupling coefficients for one or more vias or paths are also disclosed.

18 Claims, 16 Drawing Sheets

OTHER PUBLICATIONS

Haraguchi et al.,"A New Method for Extracting the Capacitance Coupling Coefficients of Sub-0.5-um Flash Memory Cells in the Negative Gate Bias Mode", Mar. 1998, IEEE International Conference on Microelectronic Test Structures, Proceddings pp. 229-233.*

Birchak et al., "Coupling Coefficient for Signal Lines Separated by Ground Lines on PC Boards", Aug. 1989, IEEE International Test Conference, Proceedings pp. 190-198.*

* cited by examiner

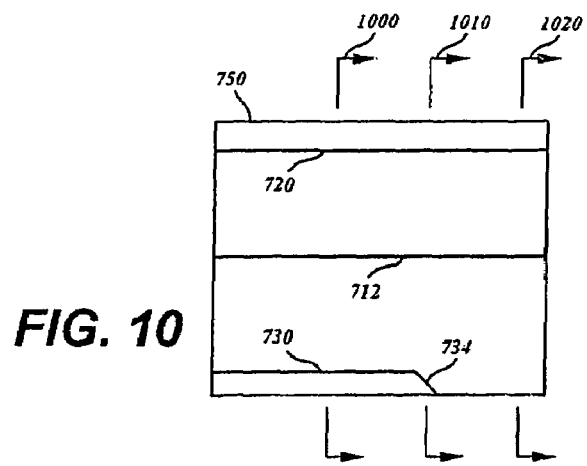
FIG. 10
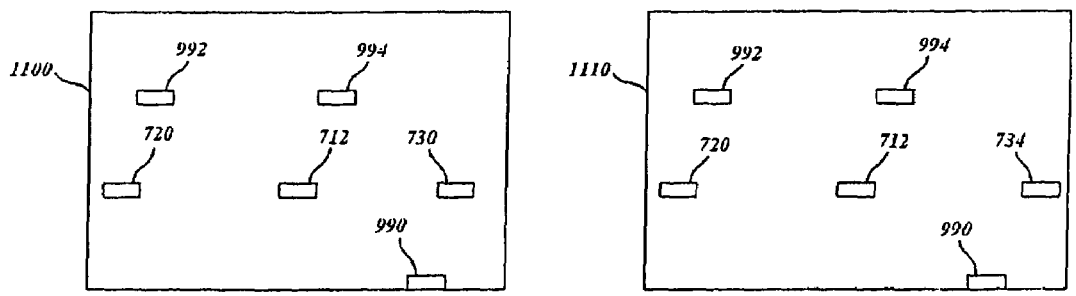
FIG. 11A    FIG. 11B
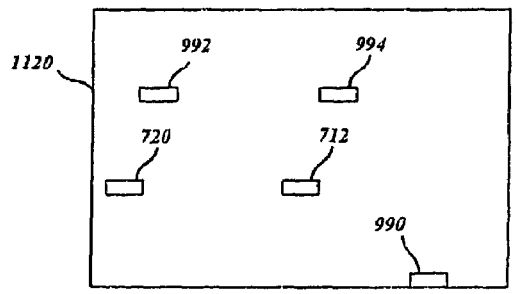
FIG. 11C
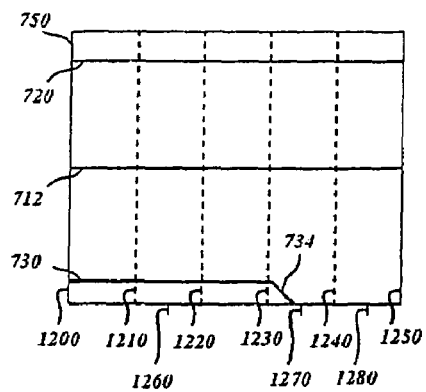
FIG. 12

SYSTEM AND METHOD FOR DETERMINING SIGNAL COUPLING COEFFICIENTS FOR LINES

BACKGROUND

The design of most printed circuit boards, integrated circuit packages and integrated circuits ("substrates") is accomplished today via electronic design automation ("EDA") logic or software tools, such as, e.g., Allegro or the Advanced Package Designer ("APD") by Cadence Designs Systems, Inc. Such tools facilitate the physical circuit layout of single or multi-layered substrates comprising multiple nets, paths, vias and traces. For example, using an EDA tool, a substrate designer locates and describes the lines and vias which comprise nets of the substrate, including the physical properties thereof such as width, shape, spacing, etc.

As substrates become smaller and the designs thereof become more complex (i.e., the amount of vias and traces becomes more dense), substrate designers are more mindful of the potentially negative effects (e.g., signal delay and distortion) of the electromagnetic interactions of the connective elements of the nets in the substrate. For example, capacitive signal coupling may occur between such elements of the substrate. If kept below a threshold level, such signal coupling will likely not have a significant effect on substrate performance. If allowed to exceed such a threshold level, however, such signal coupling may have a significantly deleterious effect on substrate performance.

SUMMARY

In accordance with one embodiment of the present invention, a system for determining a signal coupling coefficient of a line in a substrate represented in a circuit design database is provided. The system includes electronic design automation logic for designing the substrate and line signal coupling coefficient logic for determining the signal coupling coefficient of a target line.

In accordance with another embodiment of the present invention, a system for determining a signal coupling coefficient of a line in a substrate is provided. The system includes line signal coupling coefficient logic for determining the signal coupling coefficient of a target line. Line signal coupling coefficient logic includes line input parameter logic, create virtual 3-D window logic, parse by line segment logic and determine line segment signal coupling coefficient logic.

In accordance with another embodiment of the present invention, an apparatus for determining a signal coupling coefficient of a line in a substrate design contained in a circuit design database is provided. The apparatus includes a line signal coupling coefficient tool.

In accordance with another embodiment of the present invention, a method for determining a signal coupling coefficient of a line in a substrate represented in a circuit design database is provided. The method includes the steps of identifying a target line, creating a virtual 3-D window around the line to determine a universe of neighboring lines and determining the signal coupling coefficient of the target line to the lines in the universe of lines.

In accordance with another embodiment of the present invention, a method for determining a signal coupling coefficient of a line in a substrate is provided. The method includes the steps of identifying a target line in the substrate, obtaining a threshold value of a signal coupling coefficient, parsing the target line into at least one line segment, creating a virtual 3-D window around at least one line segment, creating at least one 2-D window from the virtual 3-D window, determining the signal coupling coefficient of the line segment to any other line segments in the 2-D window, comparing the determined signal coupling coefficient of the target line segment to the threshold value, and flagging the target line with a design rule check if the threshold value is less than or equal to the determined value.

In accordance with still another embodiment of the present invention, a computer-implemented method for determining a signal coupling coefficient for a line in an electrical circuit layout is provided. The method includes the steps of reading a threshold value for a signal coupling coefficient, identifying a line in a circuit design database, establishing a window around the line to identify additional circuit elements, calculating a signal coupling coefficient of the line based upon the additional circuit elements, and flagging the line if the calculated coupling coefficient differs from the threshold value.

An advantage of some embodiments of the present invention is that a signal coupling coefficient of a line in a circuit design database may be determined before the circuit design is physically embodied in a substrate, thus facilitating quicker and less expensive circuit design change. Another advantage of some embodiments is that a line in a circuit design database may be checked to determine if it exhibits coupling greater than a threshold value, which may degrade circuit performance. Circuit performance may thus be maintained.

BRIEF DESCRIPTION OF THE DRAWINGS

FIG. 10 is a top view of the three-dimensional window of FIG. 9 illustrating cross-section lines along which two-dimensional cross-sections of the 3-D window may be taken;

FIGS. 11A–C are 2-D cross-sections of the 3-D window of FIG. 9, taken at the cross-section lines of FIG. 10;

FIG. 12 is a top view of the 3-D window of FIG. 9 illustrating an exemplary process of selecting cross-section location at which to determine a line signal coupling coefficient;

DETAILED DESCRIPTION OF THE INVENTION

Figure 1:
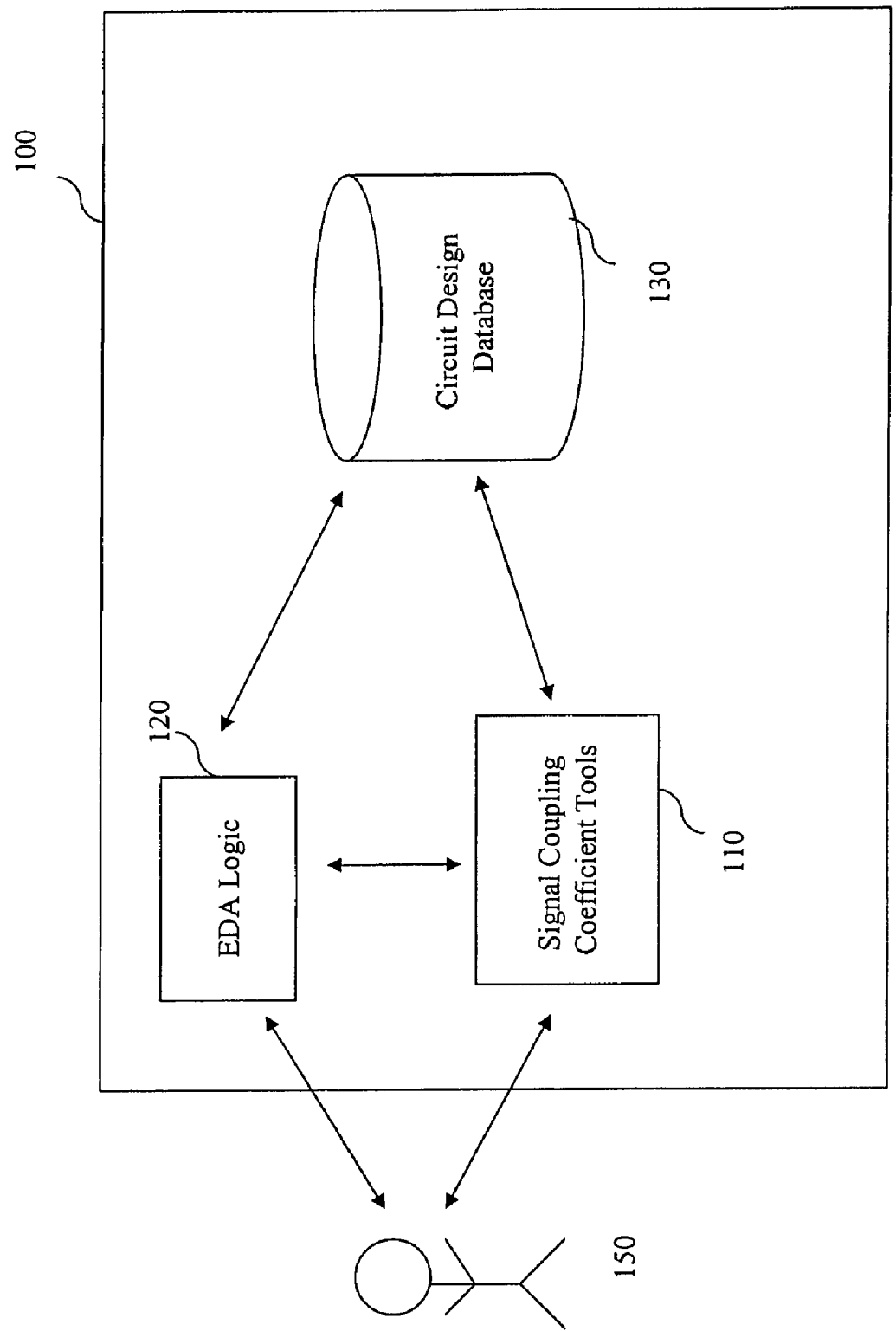
FIG. 1 is an exemplary overall system diagram of a system for determining a signal coupling coefficient of a via, line and/or path.

The following includes definitions of exemplary terms used throughout the disclosure. Both singular and plural forms of all terms fall within each meaning. Except where noted otherwise, capitalized and non-capitalized forms of all terms fall within each meaning:

As used herein, "substrate" is used generically and includes but is not limited to printed circuit boards, integrated circuit packages and integrated circuits. Except where noted otherwise, "substrate" also generally references the electrical circuitry of the substrate.

As used herein, "via" is used generically and includes a vertical conductor in a substrate such as, e.g., a vertical connector of traces between multiple layers of a substrate. For the purposes of the present invention, "via" refers to signal vias as compared to differential via pairs.

As used herein, "line" and "trace" are used interchangeably and generically and include a horizontal, i.e., parallel to the plane of the substrate, or radial conductor used to connect components and/or connective elements on a layer of a substrate. For the purposes of the present invention, "line" or "trace" refers to signal lines as compared to differential line pairs.

As used herein, "connective element" is used generically and includes vias and/or traces.

As used herein, "path" is used generically and generally refers to an electrical connection between components on a substrate, and is generally comprised of electrically connected trace(s) and via(s).

As used herein, "logic" is used generically and includes but is not limited to hardware, software and/or combinations of both to perform a function.

As used herein, "software" is used generically and includes but is not limited to one or more computer executable instructions, scripts, routines, algorithms, modules or programs (including separate applications or from dynamically linked libraries) for performing functions as described herein. Software may also be implemented in various forms such as a servlet, applet, stand-alone, plug-in or other type of application. Software can be maintained on various computer readable mediums as known in the art.

As used herein, "computer-readable medium" is any medium that contains computer readable information. "Computer-readable medium," for example, includes electronic, magnetic, optical electromagnetic, infrared, or semiconductor media. More specific examples include but are not limited to a portable magnetic computer diskette such as floppy diskettes or hard drives, a random access memory (RAM), a read-only memory (ROM), an erasable programmable read-only memory, or a portable compact disk.

The following patent applications have been filed concurrently herewith and are incorporated herein by reference:

"System and Method for Determining Signal Coupling Coefficients for Vias,"

Ser. No. 10/838,855; and

"System and Method for Determining Signal Coupling in a Design,"

Ser. No. 10/838,851.

The following patent applications reference systems and methods for determining impedance in a substrate and are incorporated herein by reference:

"Signal Line Impedance Verification Tool," Ser. No. 10/365,848, filed on Feb. 13, 2003; and "Signal Via Impedance Verification Tool," Ser. No. 10/366,279, filed on Feb. 13, 2003.

With reference to FIG. 1, an overview of a system for determining signal coupling coefficients 100 is shown. In this embodiment, system 100 includes EDA logic 120, circuit design database 130 and one or more signal coupling coefficient ("SCC") tools 130. User 150, typically a substrate designer, accesses EDA logic 120 to facilitate the design of a substrate or part(s) thereof. EDA logic 120 is any suitable substrate design tool, including but not limited to commercially available software design tools such as Allegro or APD by Cadence Designs Systems, Inc. of San Jose, Calif. and similar design tools available from Mentor Graphics Corp of Wilsonville, Oreg. and Zuken Ltd. of Westford, Mass.

EDA logic 120 communicates with circuit design database 130 to facilitate design of a substrate. Circuit design database 130 is generally provided by the provider of EDA logic 120 and may be incorporated therewith. Circuit design database 130 stores information relating to the connective elements and connectivity of a substrate designed with EDA logic 120 (i.e., information relating to the substrate design). Circuit design database 120 is any suitable database storing any suitable connectivity information regarding a substrate being designed with EDA logic 120. For example, circuit design database 130 usually contains a description of the connections and physical properties and layout of the electrical circuit(s) in a substrate, such as the position, size and shape of traces, vias, components, etc. For vias, circuit design database 130 optionally contains layout information containing the names, sizes, location and layer, etc., of vias that carry signals in the substrate, and may further contain information regarding ground vias. For lines, circuit design database 130 optionally contains information about the lines, such as, e.g., the net to which the line belongs, the line thickness and the start and stop locations for each segment of the line. Circuit design database 130 may optionally contain design rule violations, or design rule checks ("DRC"), as described herein. While circuit design database 130 has been described herein with reference to a single database, it will be appreciated that circuit design database 130 may be embodied in multiple databases.

Circuit design database 130 is accessed by EDA logic 120 and, optionally, one or more SCC tools 110. SCC tools 110 include any suitable steps, methods, processes and/or software for determining signal coupling coefficients of via(s), line(s) and/or path(s).

It will be appreciated that SCC tools 110 interact with EDA logic 120 and circuit design database 130 in any suitable way. For example, in an embodiment wherein EDA logic 120 comprises a commercial design tool such as APD, such a design tool may be bundled with a programming language (which may or may not be proprietary to the design tool) which facilitates calls to the design tool and the circuit design database associated with the design tool. Such programming functionality is akin to a "script language" or to a "macro language" as exemplified with other popular applications such as spreadsheets or database managers. For example with APD, the design tool and the associated circuit design database may be accessed by the "Skill" script language and the SCC tools 110 may be embodied therein. In this regard the SCC tools 110 may be accessed by user 150 within the APD (the EDA logic) design environment as Skill scripts running within APD. It will be appreciated that additional script and/or programming languages, such as, e.g., PERL, may be used to facilitate communication and integration between SCC tools 110 and EDA logic 120 and/or the circuit design database 130.

Alternatively, SCC tools 110 comprise a "plug-in" tool or application which is designed to "plug-in" to the functionality offered by a design tool (EDA logic) as described herein. Such a "plug-in" tool can call certain functions of the design tool (e.g., for assistance in determining a window in which to determine capacitance) and can query the circuit design database (e.g., for retrieving physical characteristics of a via or a trace). It will be appreciated that SCC tools 110 may also be integral with EDA logic (i.e., one of many functions or components which comprise the design tool) or may be stand-alone application(s) which access the circuit design database without interacting with EDA logic. In embodiments wherein SCC tools 110 are stand-alone applications, a user 150 may access the SCC tools 110 directly, and SCC tools 110 may in turn access the circuit design database directly.

It will be appreciated that each of the SCC tools 110 described herein may exist independently or be used with each other. For example, the via signal coupling coefficient ("VSCC," as described further herein) tool may be independently used by user 150 without accessing any other of the SCC tools 110, as is the case with the line signal coupling coefficient ("LSCC," also described further herein) tool. It will be appreciated, however, that the path signal coupling coefficient ("PSCC," also described herein) tool calls either or both of the VSCC and the LSCC depending upon the composition of the path being analyzed. While each of the SCC tools 110 will be described herein as a component of system 100, it will be appreciated that each SCC tool 110, in an embodiment, comprises an apparatus for determining signal coupling coefficient(s), such as, e.g., embodied as a plug-in tool and/or function.

Figure 2:
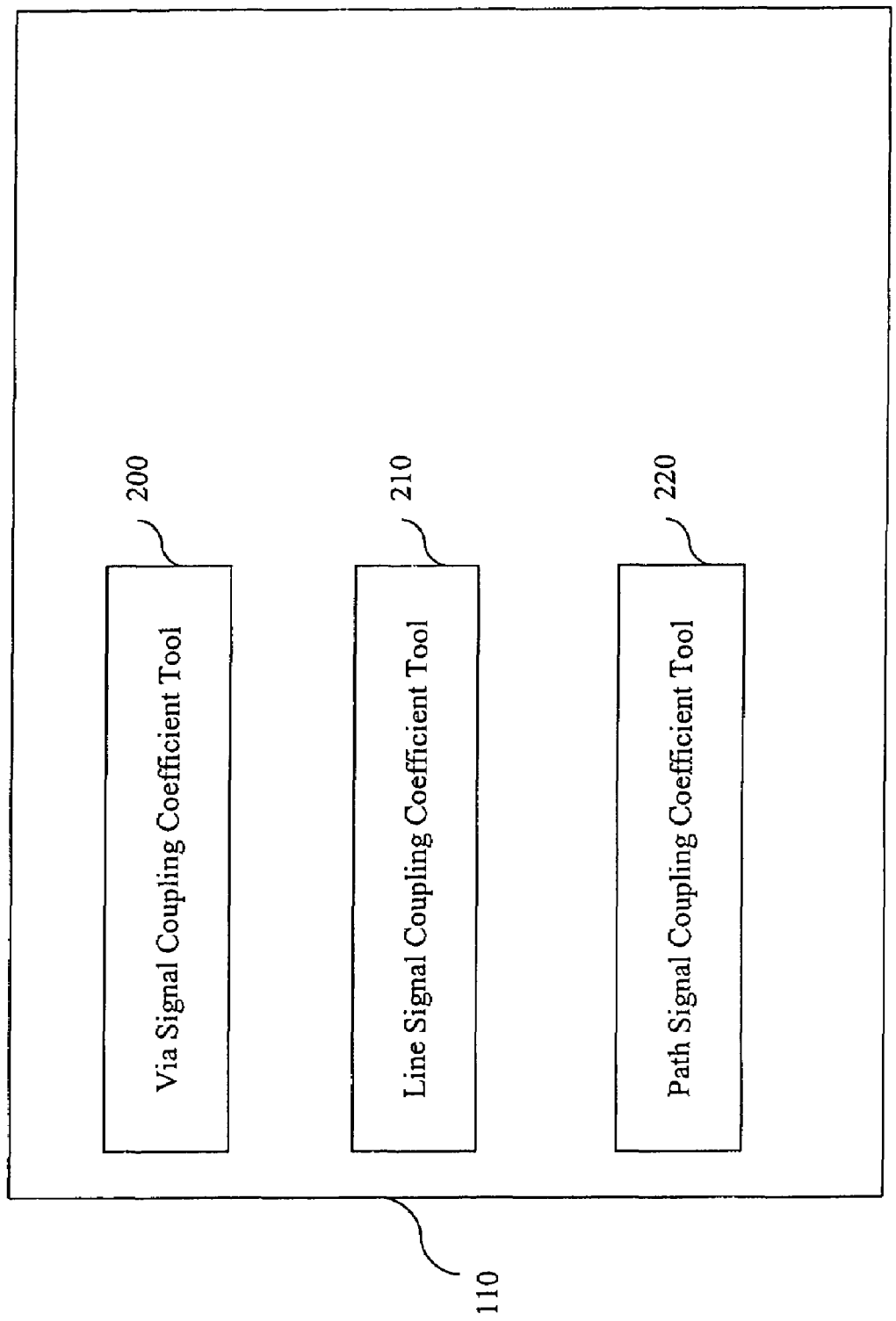
FIG. 2 is an exemplary system diagram of a component of a system for determining a signal coupling coefficient.

With reference to FIG. 2, SCC tools 110 comprise a via signal couple coefficient ("VSCC") tool 200, a line signal couple coefficient ("LSCC") tool 210 and a path signal coupling coefficient ("PSCC") tool 220. Each tool will be described herein.

Via Signal Coupling Coefficient Tool

The VSCC tool 200 determines the capacitive signal coupling coefficient of an identified via and one or more vias in a window including the identified via. The determined coupling coefficient is compared to a threshold coupling coefficient. If the determined coupling coefficient is not within a desired tolerance of the threshold coupling coefficient, a fault is optionally noted and is further optionally stored in the circuit design database as a design rule check (a "DRC").

Figure 3:
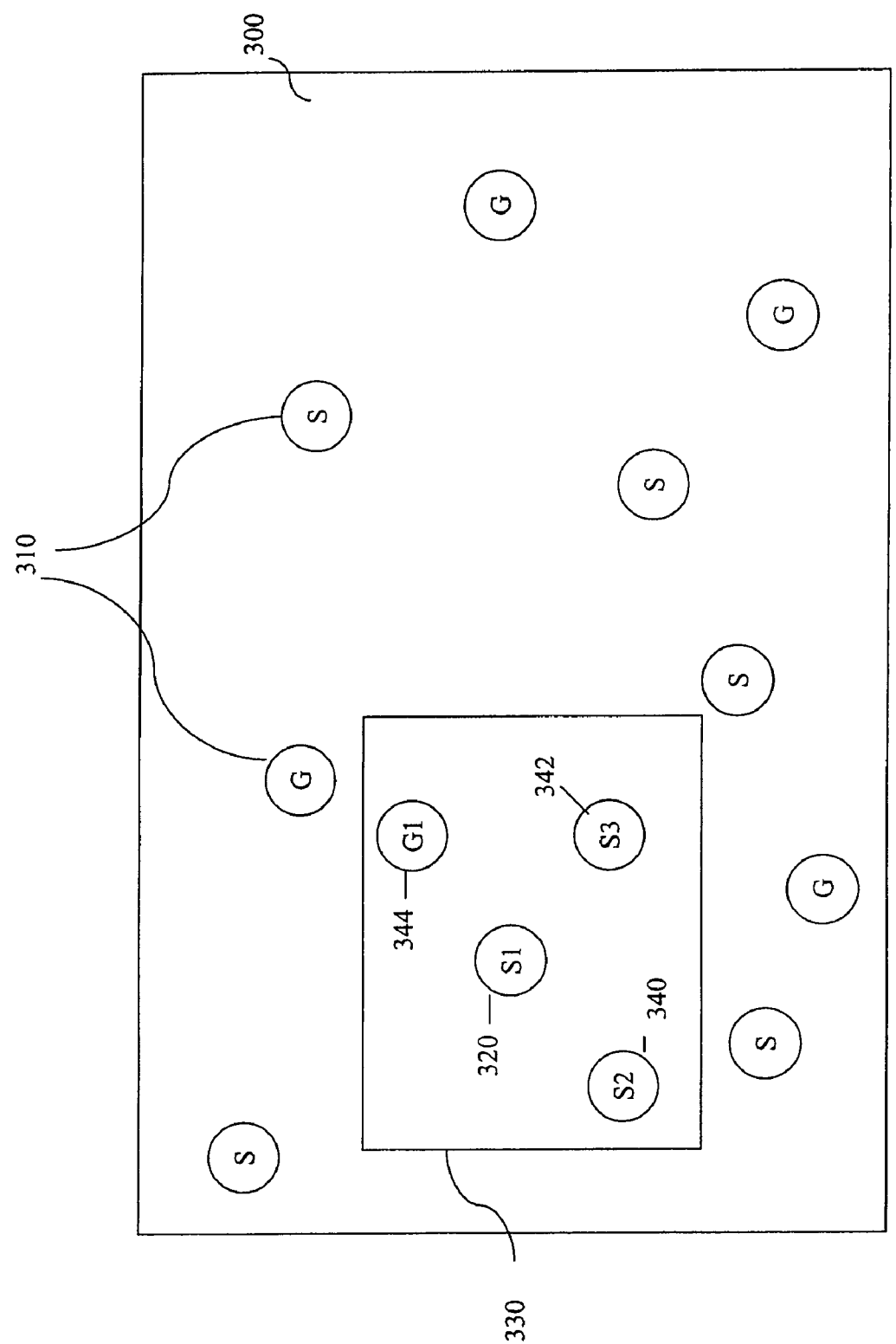
FIG. 3 is a top view of a portion of a layer in an exemplary circuit illustrating a plurality of vias.

With reference to FIG. 3, a portion of a layer of a substrate is illustrated. While a substrate typically has multiple layers, a single layer 300 is illustrated for exemplary purposes. It will be appreciated that only vias are shown in FIG. 3, and traces and other elements which would typically be on such a layer have been omitted. It will further be appreciated that placement of the vias in FIG. 3 is exemplary, and is not intended to limit the disclosure or scope of the present invention.

Layer 300 contains multiple vias 310 including both signal vias (marked with an "S") and ground vias (marked with a "G"). Signal vias are vias that carry signals during circuit operation. Ground vias are connected to an electrical ground. In an embodiment, a user identifies a target via (e.g., via S1 320) and a window 330 in which to determine the signal coupling coefficients therewith. The window is searched to identify any vias within the window (e.g., via S2 340, S3 342 and G1 344). The signal coupling coefficient is determined between and/or among the target via S1 and the identified vias S2, S3 and G1.

Figure 4:
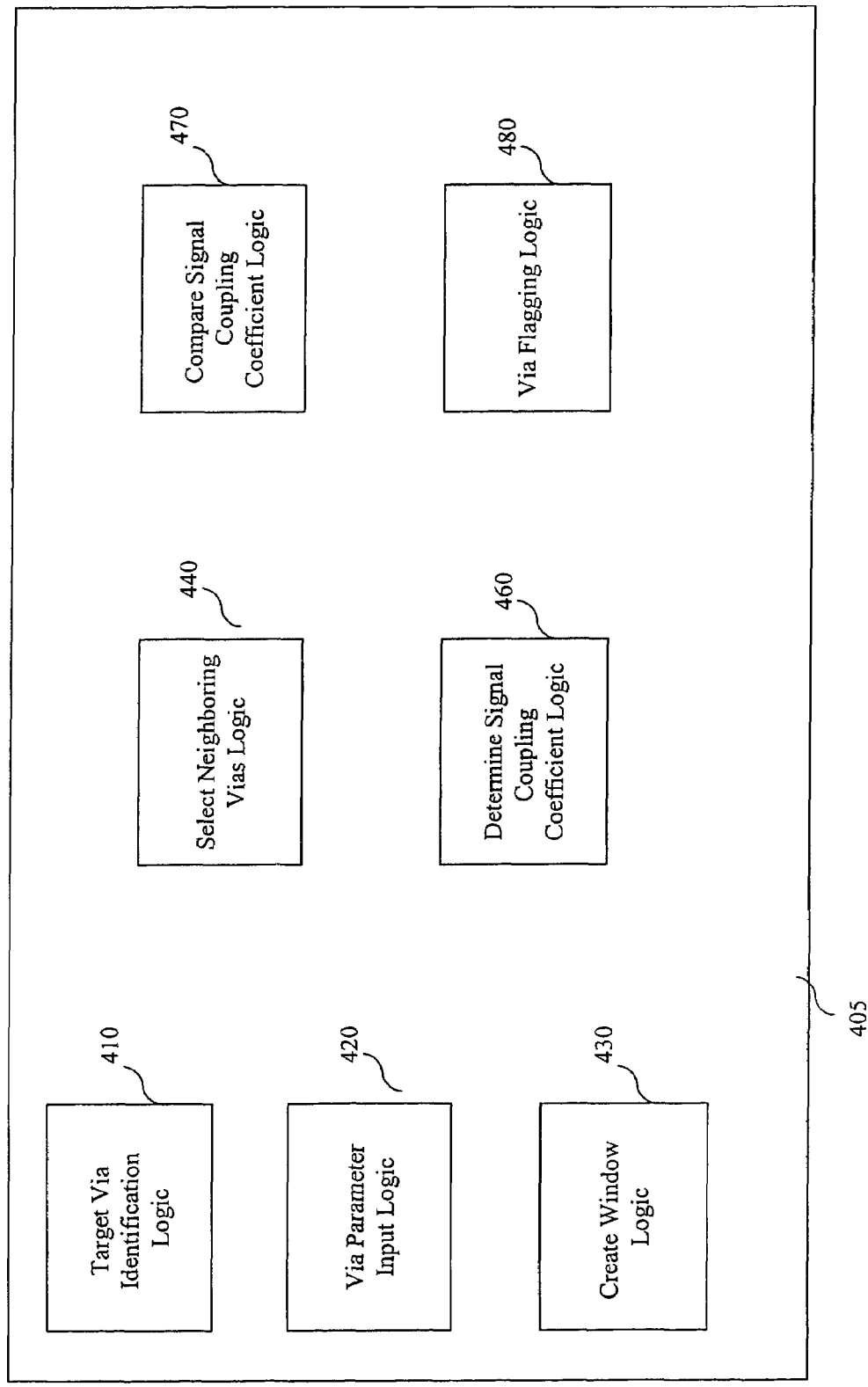
FIG. 4 is an exemplary system diagram of a component of a system for determining a via signal coupling coefficient.

With reference to FIG. 4, VSCC tool 200 includes VSCC logic 405. VSCC logic 405 includes any suitable steps, methods, processes and/or software for determining the capacitive signal coupling coefficient of an identified via and one or more vias in a window which contains the identified via. In an embodiment, VSCC logic 405 includes target via identification logic 410, create window logic 430, select neighboring vias logic 440, determine signal coupling coefficient logic 460 and, optionally, via parameter input logic 420, set neighboring vias to ground logic 450, compare signal coupling coefficients logic 470 and via DRC flagging 480.

Target via identification logic 410 includes any suitable steps, methods, processes and/or software for identifying a via for which a signal coupling coefficient is to be determined. For example, a user (with reference to FIG. 1, 150) inputs the identity of a target via or a plurality of target vias. It will be appreciated that the identity can be input in any suitable manner. For example, the VSCC tool 200 optionally provides a window for a user in which the user may select one or more target vias. The target vias may be identified by name (or other unique identifier recognized by the circuit design database and/or the script language which accesses the circuit design database) or may be selected from a list of available target vias as contained in the circuit design database (which may be optionally grouped by, e.g., layer, net and/or path). Optionally, a predetermined list of vias (such as a list of all vias in a circuit design database) may be input. Further optionally, the identity of one or more vias may be input by PSCC tool 220 during the processing thereof, as described further herein. In the embodiment illustrated in FIG. 3, an exemplary target via is identified as S1 320.

Via parameter input logic 420 includes any suitable steps, methods, processes and/or software for receiving or otherwise identifying one or more parameters which may effect the processing of VSCC logic 405. It will be appreciated that these input parameters may be either input by a user or hard-coded into the tool. It will further be appreciated that the nature and identity of the inputs will depend upon the desired results achieved by the VSCC logic. For example, via parameter inputs may include the window size (as described further herein), a threshold capacitive signal coupling coefficient (a "threshold value"), a tolerance for the threshold value and material properties of any component of the substrate. The threshold value is entered in any suitable manner, including but not limited to an exact coefficient value or as an acceptable tolerance around a desired coefficient value. For example, a designer/user may identify a threshold coupling value (a K factor) of 10%. Any determined K factor greater may thus be flagged with a DRC (as described further below). Suitable material properties include, but are not limited to, the characteristics of the material which comprises the substrate, such as the dielectric constant, the electric permittivity epsilon and the magnetic permeability mu. As with inputs for the target via identification logic 410, via parameter inputs are input in any suitable manner, such as, e.g., an input window having input boxes for each parameter.

Create window logic 430 includes any suitable steps, methods, processes and/or software for creating a window around the target via for the purpose of identifying the universe of neighboring via(s) for which a signal coupling coefficient is to be determined. The size of the window determines the scope of the signal coupling coefficient determination, as one of the factors in such a determination is the effect of neighboring vias on the target via. Generally speaking, as the distance increases between the target via and the neighboring vias, the effect of the neighboring vias on the signal coupling coefficient decreases. A window having a finite window size is thus created to limit the area in which neighboring vias are considered in the signal coupling coefficient determination for the target via. For example with reference to FIG. 3, a window 330 is defined which includes the target via S1 320 and three other vias, S2 340, S3 342 and G1 344. All other vias on layer 300 are outside window 330 and are therefore excluded from the signal coupling coefficient determination.

The size of the window is determined by any suitable manner, including but not limited to by hard-coding into the tool (i.e., a static window size) or by user input (i.e., a dynamic window size identified by the user). The window is any suitable shape, such as circular, rectangular, etc. For example, a user inputs a value for a radius of a window, and a window is created with the inputted value, or a user inputs a value of a length, and a square window is created having the dimensions of the length. In an additional example, a window is graphically created by a user in a graphical representation of a substrate layer, such as illustrated in FIG. 3. In any case, the window is centered around the target via.

Select neighboring vias logic 440 includes any suitable steps, methods, processes and/or software for identifying and/or selecting all vias contained within the window identified in create window logic 430. For example, upon creating window 330, the VSCC tool accesses the circuit design database to determine how many and which vias are contained within the window. In the embodiment exemplified in FIG. 3, vias S2, S3 and G1 are identified as being in the window with target S1 and are thus selected for determining the signal coupling coefficient.

Determine signal coupling coefficient logic 460 includes any suitable steps, methods, processes and/or software for determining the signal coupling coefficient (e.g., capacitive) between and/or among the target and neighboring vias. It will be appreciated that any suitable method for making such a determination, or calculation, is used. For example, upon determining the identity of the target and neighboring vias and retrieving the properties of such vias from the circuit design database, such properties are submitted to any suitable electromagnetic solver for determination of the signal coupling coefficient as represented by, e.g., a K factor ("K factor"). An exemplary suitable electromagnetic solver is the Raphael Interconnect Analysis application available from Synopsys, Inc. of Mountain View, Calif.

Figure 5:
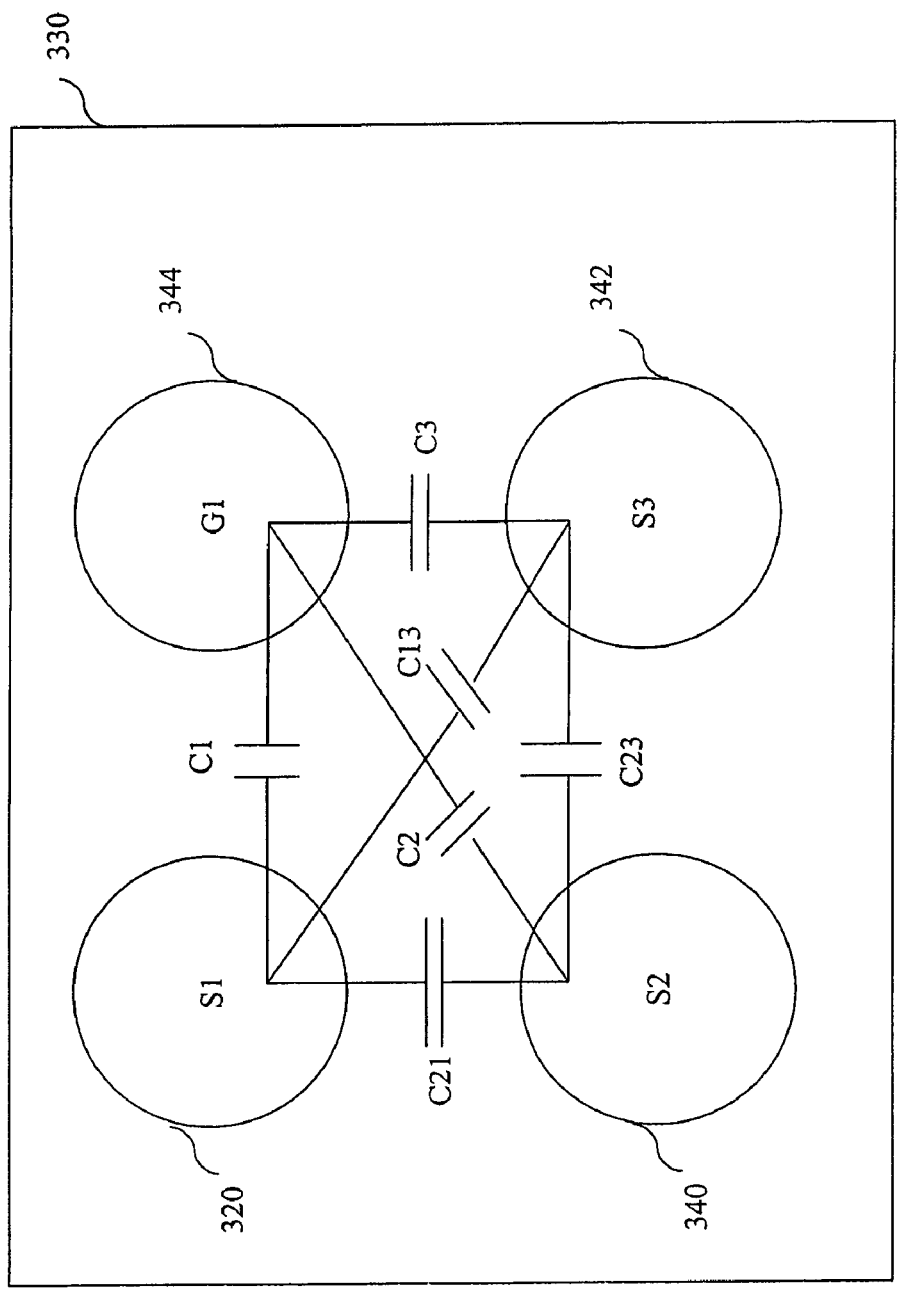
FIG. 5 is a top view of a portion of a layer in an exemplary circuit illustrating the capacitive relationships between vias.

An exemplary determination of a signal coupling coefficient is described with reference to FIG. 5, which illustrates a simplified version of the target and neighboring vias of window 330 of FIG. 3. It will be appreciated that the vias of FIG. 5 have been rearranged for the purpose of describing an exemplary determination of the coupling coefficient, and that such rearranging is not intended to limit the scope of the present invention in any way. In FIG. 5 via S2 340 has been identified as the target via. By window 330, vias S1 320, S3 342 and G1 344 have been identified as neighboring vias. The physical properties of the target and neighboring vias are retrieved from the circuit design database. These properties (and other information regarding the vias if desired) are entered into a suitable electromagnetic solver. The electromagnetic solver determines the capacitance matrix of the inputted vias; i.e., the capacitance between each of the vias. In FIG. 5, the capacitances in the capacitance matrix are labeled as "C21" for the capacitance between vias S1 and S2, "C23" for the capacitance between vias S1 and S3, "C2" for the capacitance between vias S2 and G1 (ground), "C1" for the capacitance between vias S1 and G1, etc.

Upon determining the capacitance matrix, the signal coupling coefficient (K factor) is determined by dividing the sum of the mutuals to the target via by the sum of the capacitance of the target via to all grounds, or the sum of the mutuals to the target via plus the capacitance of the target via to ground. With reference to the capacitance matrix described above with further reference to FIG. 5, the coefficient (K factor) can be determined as:

$$K=(C21+C23)/(C2+C21+C23) \qquad (1)$$

which can be restated as:

$$k = \left. \frac{\sum_{j=1}^{N} C_{ij}}{C_i + \sum_{j=1}^{N} C_{ij}} \right|_{i \neq j} \qquad (2)$$

wherein "K" is the K factor, "i" is the number of the target via (in formula 1, i=2 for S2 as the target via), "j" is an incremental counter and N is the number of mutuals (non-ground neighboring vias; in formula 2, N=3).

Compare signal coupling coefficients logic 470 includes any suitable steps, methods, processes and/or software for comparing the coupling coefficient determined by determine signal coupling coefficient logic 460 with the threshold value for the coupling coefficient. For example, the determined value is compared to the threshold value to determine if the determined value is greater than or equal to the threshold value. Optionally, any difference between the two values is compared against a tolerance value to determine if the difference is within tolerance.

Via flagging logic 480 includes any suitable steps, methods, processes and/or software for taking any action based upon the results of the comparison taken by compare signal coupling coefficients logic 470. For example, in an embodiment, via flagging logic 460 comprises outputting one or both of the determined and threshold coupling coefficients and, optionally, the difference between the two. Optionally, if the determined coupling coefficient is greater than the threshold value, or not within the tolerance, via flagging logic 480 may further flag the target via as having a noteworthy, or possibly deleterious, signal coupling coefficient. Via flagging logic 480 flags the target via in any suitable manner. For example, via flagging logic 480 may create a design rule check (a "DRC") as a flag for the target via. The DRC is optionally stored in the circuit design database or outputted to the user. Via flagging logic 480 may optionally indicate any flagged target via directly to the user, may store a list of flagged target vias separately, and/or may indicate the flagged target via to the EDA logic as desired.

Figure 6:
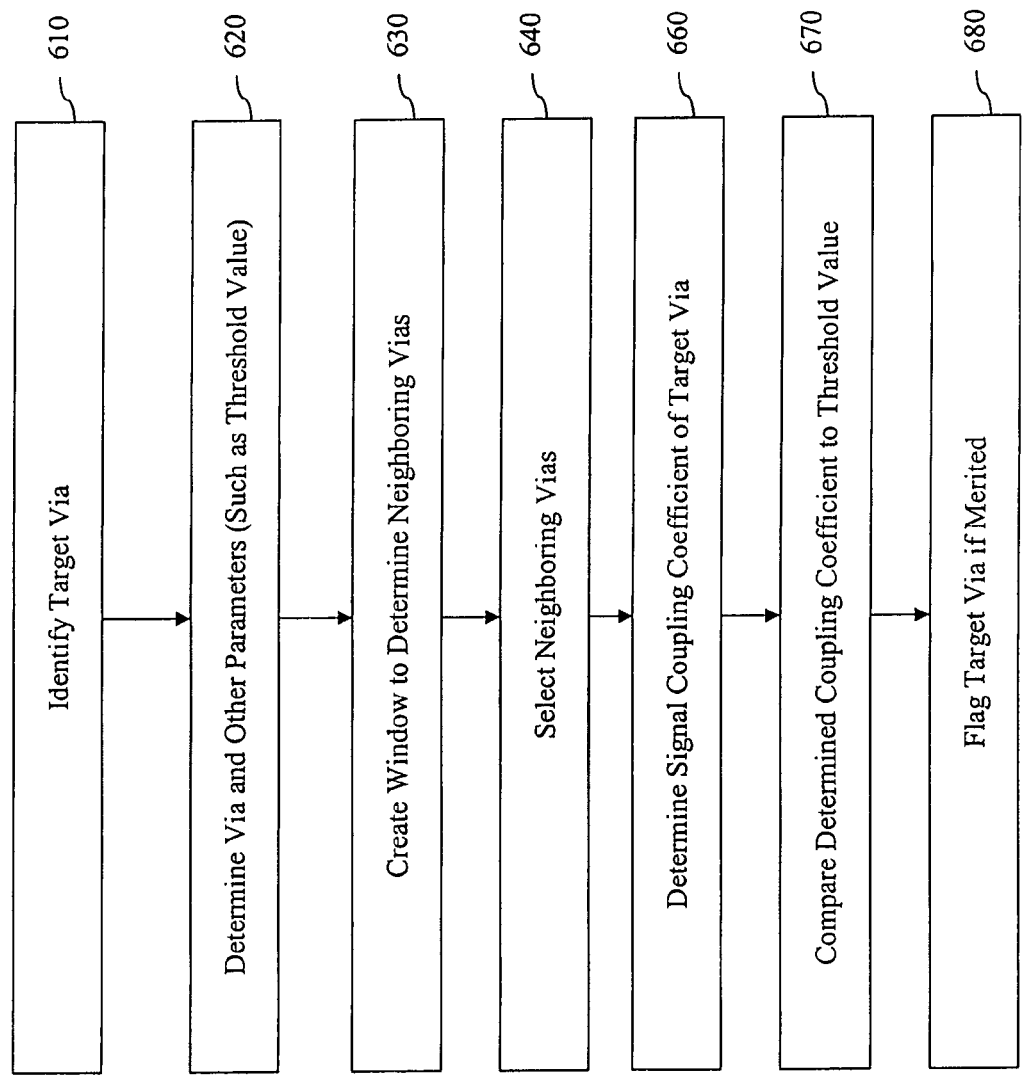
FIG. 6 is a block diagram showing and exemplary methodology for determining a via signal coupling coefficient.

FIG. 6 shows an exemplary methodology for determining signal coupling coefficients for vias. The blocks shown represent functions, actions or events performed therein. If embodied in software, each block may represent a module, segment or portion of code that comprises one or more executable instructions to implement the specified logical function(s). If embodied in hardware, each block may represent one or more circuits or other electronic devices to implement the specified logical function(s). It will be appreciated that computer software applications involve dynamic and flexible processes such that the functions, actions or events performed by the software and/or the hardware can be performed in other sequences different than the one shown.

With further reference to FIG. 6, an exemplary methodology is described. At block 610, a target via is identified by any suitable method, including but not limited to by steps, methods, processes and logic described herein with respect to target via identification logic 410. The target via is the via for which a signal coupling coefficient is to be determined. At block 620 other parameters related to the determination of the signal coupling coefficient are optionally determined. For example, a threshold value of a signal coupling coefficient is determined. In a further example, the dimensions and other properties of a window are determined, where "a window" is a the window centered around the target via which will be used to determine which vias in the substrate are to be considered "neighboring vias" for the determination of the signal coupling coefficient of the target via. These parameters are input by a user, hard-coded into a tool, or otherwise determined as described herein with respect to via parameter input logic 420.

At block 630 a window around the target via is created by any suitable method, including but not limited to any steps, methods, processes and logic described herein with respect to create window logic 430. At block 640 all vias located within the window are selected by any steps, methods, processes and logic as described herein with respect to select neighboring vias logic 440. The vias are designated as "neighboring" vias to the target via. At block 660 the signal coupling coefficient of the target via to the neighboring via(s) is determined by any suitable method, including but not limited to any steps, methods, processes and logic described herein with respect to determine signal coupling coefficient logic 460. For example, the capacitances between and/or among the target via and the neighboring vias are determined and optionally contained in a capacitance matrix. An exemplary signal coupling coefficient is determined by dividing the sum of the capacitances of the mutuals to the target via by the sum of the capacitance of the target via to ground and the capacitances of the mutual to the target via.

At block 670 the determined signal coupling coefficient of the target via is compared to a threshold value, if one has been determined. At block 680 the target via is flagged in any suitable manner if the comparison made at block 670 indicates that a disparity exists between the determined and threshold value or that the difference between the two is not within a tolerance level. For example, a DRC may be issued if the signal coupling coefficient of a target via is greater than the threshold value. The DRC is issued and/or stored by any suitable method; e.g., by placing the DRC in the circuit design database associated with the target via.

Line Signal Coupling Coefficient Tool

The LSCC tool 210 determines the capacitive signal coupling coefficient of an identified line and/or segment thereof and one or more lines in a window (optionally three-dimensional ("3-D")) including the identified line. The determined coupling coefficient is compared to a threshold coupling coefficient. If the determined coupling coefficient is not within a desired tolerance of the threshold coupling coefficient, a fault is optionally noted and is further optionally stored in the circuit design database as a design rule check (a "DRC").

Figure 7:
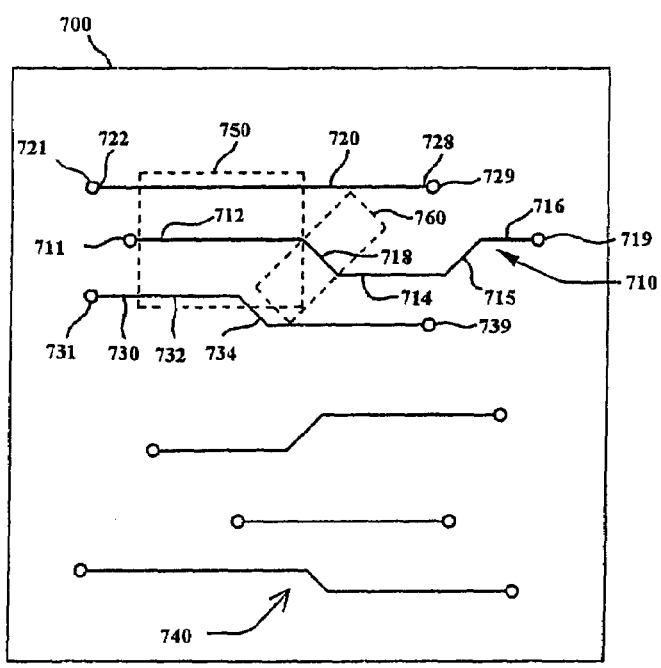
FIG. 7 is a top view of a portion of a layer in an exemplary circuit layout illustrating a target line segment for which a signal coupling coefficient will be determined.

A line segment refers to a portion of a line. Generally, lines in an electrical circuit are formed of straight line segments that intersect with vias or other line segments at various angles. For example, FIG. 7 shows a top view of a portion 700 of a layer in an exemplary circuit layout. Only traces and vias are shown in this view to simplify the drawing and explanation, omitting other elements. Note that the configuration of vias and traces in FIG. 7 is purely exemplary and is not intended to represent an actual circuit or to limit the scope of the invention disclosed herein.

A portion 710 of a target net lies on the illustrated layer, running from a start via 711 to an end via 719. The portion 710 of the target net between the start via 711 and end via 719 is formed by a series of line segments 712, 713, 714, 715, and 716. In this exemplary circuit layout, several line segments 712, 714, and 716 are oriented in the same direction with one line segment 714 offset but parallel to the other. Remaining line segments 713 and 715 are connected and are orientated at some angle, such as 45 degrees, to the other line segments 712, 714, and 716 as appropriate.

Portion 700 of a layer in an exemplary circuit layout may also contain neighboring lines 720 and 730, and more distant traces 740. Each line may end at a start and end via (e.g., 711, 719) or at other elements such as another line, or at electrical component connection pads (not shown).

Alternatively, line segments may have any other desired configuration, such as curved segments, etc., and may be selected in any desired manner to facilitate the signal coupling coefficient calculation for the net of which the line segment is a part.

In an exemplary embodiment, an LSCC tool performs signal line coupling calculations on line segments of entire nets or entire traces (e.g., 710) of nets lying on a single layer, thereby simplifying the calculation. This also aids the user 150 in preventing capacitance coupling changes along a net, which might result in reflections and other errors. (Line segments under a minimum length specified by the user 150 may be omitted from the coupling calculations for a net if desired.) However, the LSCC tool is not limited to any particular manner of dividing a net to simplify signal line coupling calculations or to subdivide error indications. In fact, the LSCC tool may calculate characteristic impedance for an entire net at once if desired, although the calculations may become more complex.

Figure 8:
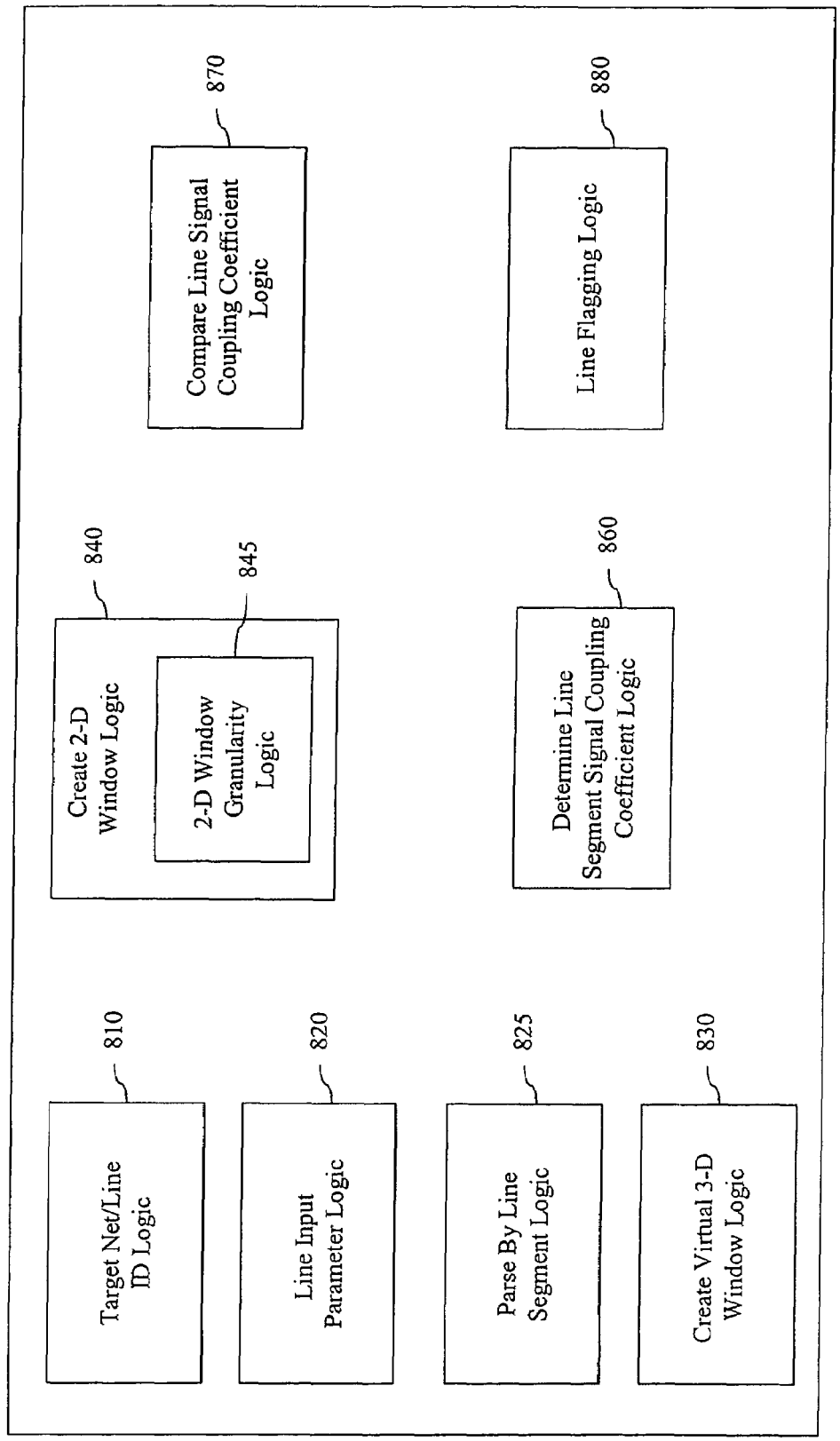
FIG. 8 is an exemplary system diagram of a component of a system for determining a line signal coupling coefficient.

With reference to FIG. 8, LSCC tool 210 includes LSCC logic 805. LSCC logic 805 includes any suitable steps, methods, processes and/or software for determining the capacitive signal coupling coefficient of a line (or one or more line segments thereof) and one or more lines (or line segments) in a window which contains the identified line (or line segment). In an embodiment, LSCC logic 805 includes target net/line identification logic 810, create virtual 3-D window logic 830, determine line segment signal coupling coefficient logic 860 and, optionally, line parameter input logic 820, parse by line segment logic 825, create 2-D window logic 840, 2-D window granularity logic 845, set neighboring lines to ground logic 850, compare line signal coupling coefficients logic 870 and line DRC flagging logic 880.

Target net/line identification logic 810 includes any suitable steps, methods, processes and/or software for identifying a single-layer net, line or line segment for which a signal coupling coefficient is to be determined. For example, a user (with reference to FIG. 1, 150) inputs the identity of a target line such as line 710 in FIG. 7. It will be appreciated that the identity can be input in any suitable manner. For example, the LSCC tool 210 optionally provides a window for a user in which the user may select one or more target lines. The target lines may be identified by name (or other unique identifier recognized by the circuit design database and/or the script language which accesses the circuit design database) or may be selected from a list of available target lines as contained in the circuit design database (which may be optionally grouped by, e.g., layer, net and/or path). Optionally, a predetermined list of lines (such as a list of all lines in a circuit design database) may be input. Further optionally a list of nets and/or layers may be outputted, and a user may select one or all lines which are included in the selected net or layer. Still further optionally, the identity of one or more lines may be input by PSCC tool 220 during the processing thereof, as described further herein.

Line parameter input logic 820 includes any suitable steps, methods, processes and/or software for receiving or otherwise identifying one or more parameters which may effect the processing of LSCC logic 805. It will be appreciated that these input parameters may be either input by a user or hard-coded into the tool. It will further be appreciated that the nature and identity of the inputs will depend upon the desired results achieved by the LSCC logic. For example, line parameter inputs may include the layers upon which to calculate the line coupling coefficient (if a target net has been selected), virtual 3-D window specifications (as described further below), line segment specifications, such as the minimum length of line segments for which a coupling coefficient will be determined (as described further below), 2-D window granularity (as described further below), a threshold capacitive signal coupling coefficient (a "threshold value"), a tolerance for the threshold value and material properties of any component of the substrate. Specifying layers allows the users 150 to exclude layers from coupling calculations (not from use as neighboring layers in windows, but on which target line segments will not be selected). For example, there may be layers which cannot be modified due to manufacturing constraints or extremely tight design constraints. There would be no reason to calculate coupling coefficients for lines on that layer, because the coupling coefficient could not be adjusted. The threshold value is entered in any suitable manner, including but not limited to an exact coefficient value or as an acceptable tolerance around a desired coefficient value. For example, a designer/user may identify a threshold coupling value (a K factor) of 10%. Any determined K factor greater may thus be flagged with a DRC. Suitable material properties include, but are not limited to, the characteristics of the material which comprises the substrate, such as the dielectric constant, the electric permittivity epsilon and the magnetic permeability mu. As with inputs for the target line identification logic 810, line parameter inputs are input in any suitable manner, such as, e.g., an input window having input boxes for each parameter.

Parse by line segment logic 825 includes any suitable steps, methods, processes and/or software for parsing or dividing a target line into one or more line segments. In an embodiment, the current design database optionally includes line segment information for every line represented therein. In such a case, line segments may be determined in accordance therewith. With reference to FIG. 7, exemplary target net 710 includes five segments 712, 713 714, 715 and 716 (the signal coupling coefficient of each which is determined in an exemplary embodiment). Of note, a user 150 may wish to avoid calculating the signal coupling coefficient of very short line segments (the minimum line segment length for which may be entered via a line input parameter to logic 820). For example, if two relatively long line segments are connected by an extremely short line segment, the coupling coefficient of the extremely short line segment will probably not vary much from the coupling coefficient at the ends of the surrounding longer line segments, because the environment of the extremely short line segment is substantially the same as that at the ends of the surrounding longer line segments. The user may prevent the LSCC tool from calculating the coupling coefficient of the extremely short line segment, thereby reducing processing time.

Create virtual 3-D window logic 830 includes any suitable steps, methods, processes and/or software for creating a virtual 3-D window around the target line or line segment for the purpose of identifying and/or selecting the universe of neighboring lines or line segments for which a signal coupling coefficient is to be determined. The capacitive signal coupling coefficient of a line segment is mainly affected by neighboring lines that are located within a certain small distance of the line segment for a relatively substantial distance along the line segment. (The capacitive signal coupling coefficient is also affected by neighboring lines that only run near the line segment for very small distances, and more distant lines, etc., but these effects are relatively small and thus are neglected in the exemplary embodiment. These elements having a small effect on characteristic impedance may be included if desired in an alternative embodiment.) The window used to identify neighboring lines for a line segment is therefore more complex than the simple two-dimensional window of the LSCC tool described above, because the neighboring elements affecting the capacitive signal coupling coefficient of the line segment are not necessarily at a constant distance along the line segment.

In an exemplary embodiment, a virtual three-dimensional (3-D) window is used. The 3-D window is virtual in this exemplary embodiment because neither EDA logic nor circuit design databases routinely support a 3-D design environment—line segments in the circuit design database are designated by their start and end location on a layer, and multiple layers are handled independently. To simulate a 3-D window, create virtual 3-D window logic 830 accesses the circuit design database to retrieve the start and end locations of lines on the target layer and neighboring layers as specified by the user 150 (and optionally input via line input logic 820), and the LSCC tool effectively interprets the data for the lines, locating them in the 3-D virtual window.

A top view of several exemplary 3-D virtual windows 750 and 760 is shown in FIG. 7. The first exemplary 3-D virtual window 750 corresponds to line segment 712, and the second exemplary 3-D virtual window 760 corresponds to line segment 713. Note that the windows 750 and 760 are aligned with their corresponding line segments 712 and 713.

Also note that the windows 750 and 760 are aligned with their corresponding line segments 712 and 713. The windows 750 and 760 may be specified by the user as the lateral or radial distance perpendicular from the target line segment to include on either side of the target line segment, and the number of layers above and below the target layer to consider. For example, if the user specified a distance of 800 microns the virtual 3-D window would extend 800 microns on either side of the target line segment on a layer, with the target line segment centered in the 1600 micron wide window.

Figure 9:
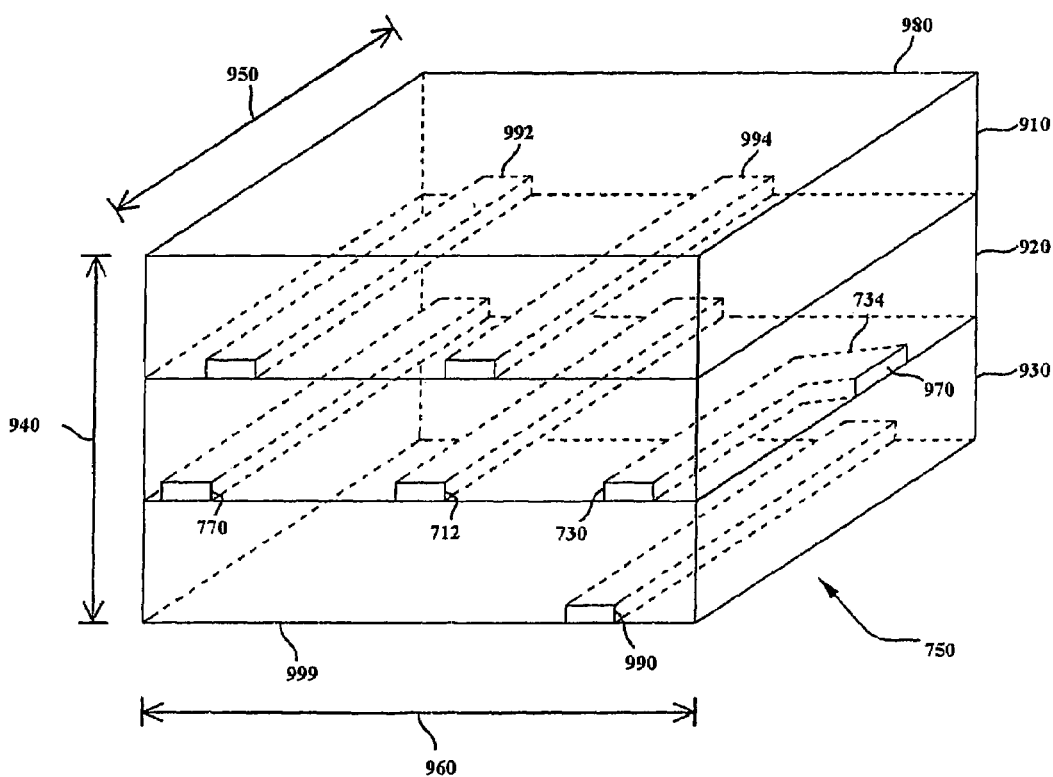
FIG. 9 is a perspective view of an exemplary three-dimensional window in which lines will be considered in determining a line signal coupling coefficient.

A perspective view of the first virtual 3-D window 750 of FIG. 7 is shown in FIG. 9. The exemplary window 750 includes three layers, the target layer 920, a layer above 910 and a layer below 930. Note that the window 750 is not square (or cubical) in this exemplary embodiment. The height 940 of the window 750 depends on the number of layers considered and the physical height of each layer. The length 950 corresponds to the length of the target line segment 712, and the width 960 may be input by the user (or may be hard-coded in the LSCC tool).

The target line segment 712 is centered in the target layer 920, and is surrounded on the target layer 970 by two neighboring lines 720 and 730 in the window 950. Given the start and end positions 722 and 728 of the first neighboring line 750 (at vias 721 and 729), it may be determined that the first neighboring line 720 parallels the target line segment 712 along the entire length of the window 750. However, the second neighboring line (ending at vias 731 and 739) has multiple segments, two of which 732 and 734 lie at least partially within the window 750. The first line segment 732 parallels the target line segment 712. The second line segment 734 is oriented at an angle to the target line segment 712, exiting a side 970 of the window 750 before reaching the end 980. Thus, at a portion of the window 750 near the end 980, the second neighboring line (ending at via 739) is not in the window 750.

Layer 980 contains a line 990 running parallel to the target line segment 712. Layer 910 contains two lines 992 and 994 also running parallel to the target line segment 712. As with the vias described above with respect to the LSCC tool, the lines may carry signals or optionally be set to ground (as described further herein) or other reference voltage. In the exemplary circuit described herein, the two lines 992 and 994 in the upper layer 910 are ground lines, part of a ground grid in the upper layer 910.

To calculate characteristic impedance for the target line segment 712 in the virtual 3-D window 750, a series of two-dimensional (2-D) calculations are made, or optionally a single 3-D calculation is made. In an embodiment, create 2D window logic 840 includes any suitable steps, methods, processes and/or software for creating at least one two-dimensional window (e.g., a 2-D slice) out of a virtual 3-D window. For example, the LSCC tool employs a series of 2-D calculations, calculating the signal coupling coefficient of the target line segment 712 based on neighboring lines in a 2-D slice or cross-section of the virtual 3-D window 750. This is illustrated in FIGS. 10 and 11A–C. FIG. 10 is a top view of the virtual 3-D window 750 taken on the target layer 920, including the target line segment 712 and the neighboring line segments 720, 730, and 734. Signal coupling coefficient determinations may be made on any suitable number of 2-D cross-sections of the window 750, such as along cross-section lines 1000, 1010, and 1020.

The first 2-D face 1100 taken at cross-section line 1000 is illustrated in FIG. 11A. Note that the 2-D face 1100 at cross-section line 1000 is identical to the front face 999 of the virtual 3-D window 750 shown in FIG. 9, because the lines 712, 720, 730, 990, 992, and 994 all run parallel together from the front face 999 of the window 750 to the first cross-section line 1000.

The second 2-D face 1110 viewed at cross-section line 1010 is illustrated on FIG. 11B. The only change on this 2-D face 1110 is that line segment 770 does not appear in this cross-section, having been replaced by connected line segment 734. The line segment 734 angles away from the target line segment 712, and so appears farther to the right in this 2-D face 1110 than line segment 730 appeared in the previous 2-D face 1100.

The third 2-D face 1120 viewed at cross-section line 1020 is illustrated in FIG. 11C. The only change on this 2-D face 1120 is that line segments 730 and 734 are not in the window 750 in this cross-section.

Create 2-D windows logic 840 optionally includes 2-D windows granularity logic 245. 2-D windows granularity 245 includes any suitable steps, methods, processes and/or software for determining the granularity of the amount of 2-D windows taken from the virtual 3-D window; i.e., it determines how many 2-D slices are taken, and how often. 2-D windows granularity logic 245 is illustrated with reference to FIG. 12, which is a top view of the virtual 3-D window 750 taken on the target layer 920, including the target line segment 712 and the neighboring line segments 720, 730, and 734. A granularity is determined for the cross-sections as discussed above with respect to FIGS. 10 and 11A–11C. In this example, assume that the target line segment 712 is 1 millimeter (mm) long, so the window 750 is 1 mm long, and that a granularity of 0.2 mm was specified by the user or was hard-coded in the tool. The window 750 is therefore divided into five sections by the start 1200 of the window 750, by four section lines 1210, 1220, 1230, and 1240 placed at 0.2 mm intervals, and by the end 1250 of the window 750.

The LSCC tool examines slices through the window 750, determining whether the traces change position in the slice. This enables the tool to avoid calculating the signal coupling coefficient of the target line segment 712 multiple times for slices that are identical. For example, the traces 712, 720, and 730 do not change position in the window 750 in the first three slices between 0 mm 1200 and 0.2 mm 1210, 0.2 mm 1210 and 0.4 mm 1220, and 0.4 mm 1220 and 0.6 mm 1230. The traces 712, 720, and 730 run parallel through this section of the window 750, so it would waste time to perform a signal coupling calculation for each of these three sections. Instead, the exemplary LSCC tool performs a single signal coupling calculation at one cross-section location in the homogeneous region made up of the three sections from 0 mm 1200 to 0.6 mm 1230. Although this cross-section may be taken at any location in this homogeneous region, the exemplary LSCC tool performs the impedance calculation at the midpoint of the region, in this case at 0.3 mm 1260. If the calculated signal line coupling coefficient were incorrect, the target line segment 712 is flagged (as described further below) as incorrect and the signal coupling calculation process for the target line segment 712 may be stopped to save time.

If, however, the calculated signal line coupling coefficient were correct in the homogeneous region from 0 mm 1200 to 0.6 mm 1230, the LSCC tool considers the next region, from 0.6 mm 1230 to 0.8 mm 1240. There is a change in this region, with the neighboring trace 730 ending and moving off at an angle as segment 734, then exiting the window 750. Therefore, this segment 0.6 mm 1230 to 0.8 mm 1240 is considered by itself, with the signal coupling coefficient calculated for the target line segment 712 at the midpoint of this region, or 0.7 mm 1270. Finally, if the characteristic impedance calculated at 0.7 mm 1270 is correct, the signal line impedance verification tool considers the next region, from 0.8 mm 1240 to 1 mm 1250. Again, there is a change in this region, although this region may also be considered automatically because it was not included in previous calculations, and it is the last region in the window 750. Therefore, the signal coupling coefficient of the target line segment 712 is calculated at the cross-section taken at 0.9 mm 1280, the midpoint of the region from 0.8 mm 1240 to 1 mm 1250.

If the LSCC tool uses a series of 2-D signal coupling calculations to calculate the signal coupling coefficient of a line segment in a 3-D window, the granularity of the 2-D cross-sectional slices may be adjusted by entering the distance between slices, or the thickness of each slice. 2-D window granularity logic 845 includes any suitable steps, methods, processes, and/or software for determining the granularity (i.e., distance between) of the 2-D slices of a 3-D virtual window. For example, inputs regarding granularity are obtained vie live input parameter logic 820 and used to determine granularity. Granularity may be any fixed value (such as a fixed distance (e.g., 5 microns) or a fixed number per 2-D window (e.g., five per window) or variable value (e.g., depending upon the length of each line segment)).

Determine line segment signal coupling coefficient logic 860 includes any suitable steps, methods, processes and/or software for determining the signal coupling coefficient (e.g., capacitive) between and/or among the target and neighboring lines. For example, the total signal coupling for the target line segment 712 in the window 750 may be calculated based on the 2-D signal coupling calculations made along the target line segment 712 at various cross-sections. Optionally, however, the 2-D signal coupling calculations are not combined, and if any of the 2-D signal coupling coefficients taken at cross-sections along the target line segment 712 result in an incorrect signal couple coefficient (as described further below), the entire target line segment 712 is flagged.

It will be appreciated that any suitable method for making such a determination, or calculation, is used. For example, upon determining the identity of the target and neighboring line segments and retrieving the properties of such line segments from the circuit design database, such properties are submitted to any suitable electromagnetic solver for determination of the signal coupling coefficient as represented by, e.g., a K factor. An exemplary suitable electromagnetic solver is the Raphael Interconnect Analysis application available from Synopsys, Inc. of Mountain View, Calif.

Figure 13:
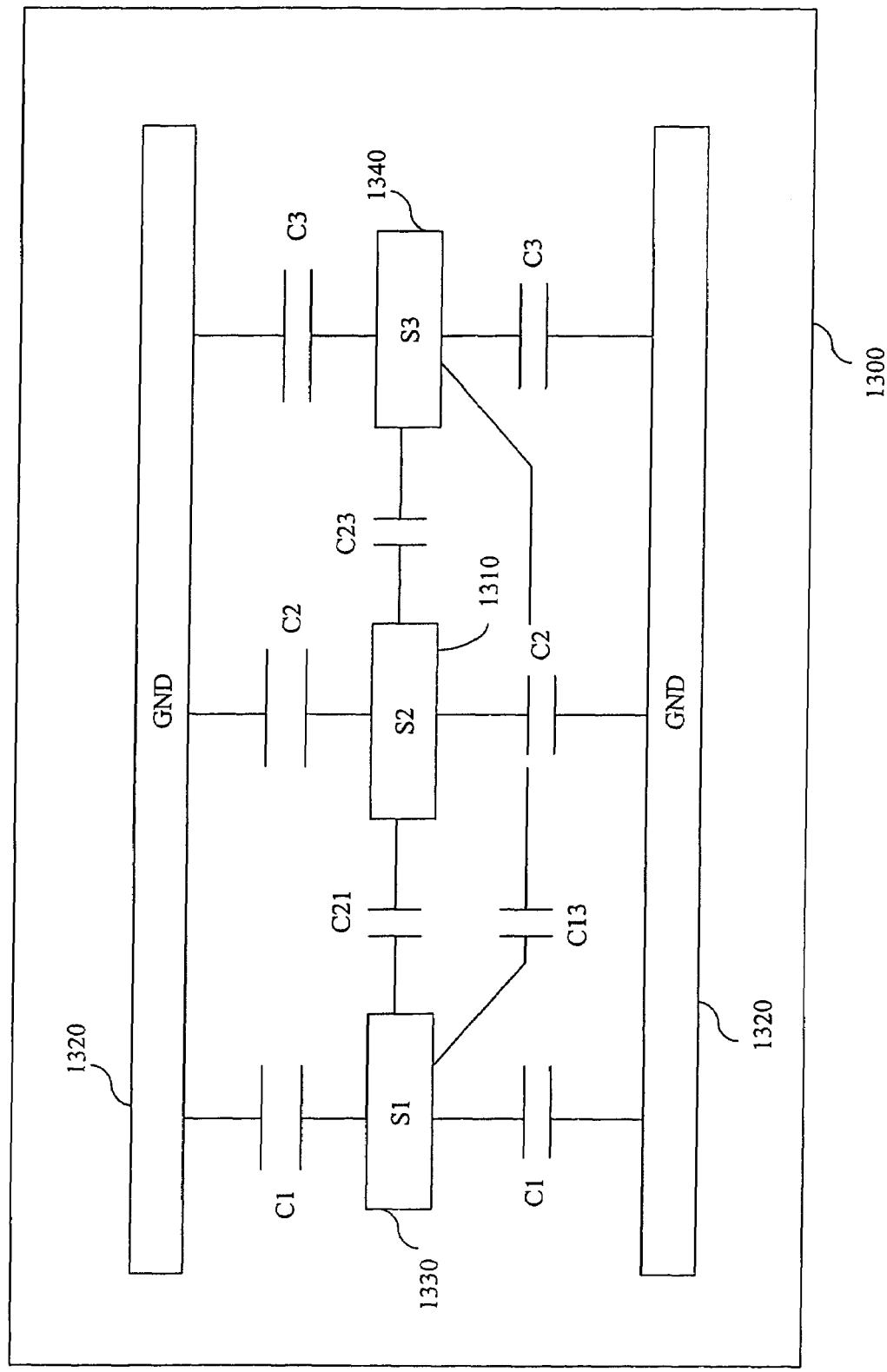
FIG. 13 is a cross-section of a portion of a layer in an exemplary circuit illustrating the capacitive relationships between lines.

An exemplary determination of a signal coupling coefficient is described with reference to FIG. 13, which illustrates a simplified version of a target line segment cross-section S2, grounds 1320 and two neighboring line segments S1, 1330, and S3 1340. It will be appreciated that the line segments of FIG. 13 have been rearranged for the purpose of describing an exemplary determination of the coupling coefficient, and that such rearranging is not intended to limit the scope of the present invention in any way. In FIG. 13 line segment S2 1310 has been identified as the target line segment. In 2-D slice 1320 of a virtual 3-D window, line segments S1 1330, S3 1340, and grounds 1320 have been identified as neighboring segments. The physical properties of the target and neighboring line segments are retrieved from the circuit design database. These properties (and other information regarding the line segments if desired) are entered into a suitable electromagnetic solver. The electromagnetic solver determines the capacitance matrix of the inputted line segments; i.e., the capacitance between each of the line segments. In FIG. 13, the capacitances in the capacitance matrix are labeled as "C21" for the capacitance between vias S1 and S2, "C23" for the capacitance between vias S1 and S3, "C2" for the capacitance between S2 and ground, "C1" for the capacitance between S1 and ground, etc.

Upon determining the capacitance matrix, the signal coupling coefficient (K factor) is determined by dividing the sum of the mutuals to the target line segment by the sum of the capacitance of the target line segment to all grounds, or the sum of the mutuals to the target line segment plus the capacitance of the target line segment to ground. With reference to the capacitance matrix described above with further reference to FIG. 13, the coefficient (K factor) can be determined as:

$$K=(C21+C23)/(C2+C21+C23) \quad (3)$$

which can be restated as:

$$k = \dfrac{\sum_{j=1}^{N} C_{ij}}{C_i + \sum_{j=1}^{N} C_{ij}} \Bigg|_{i \ne j} \quad (4)$$

wherein "K" is the K factor, "i" is the number of the target line segment (in formula 1, i=2 for S2 as the target line), "j" is an incremental counter and N is the number of mutuals (non-ground neighboring line segments; in formula 2, N=3).

Compare line signal coupling coefficients logic 870 includes any suitable steps, methods, processes and/or software for comparing the coupling coefficient determined by determine line segment signal coupling coefficient logic 860 with the threshold value for the coupling coefficient. For example, the determined value is compared to the threshold value to determine if the determined value is greater than or equal to the threshold value. Optionally, any difference between the two values is compared against a tolerance value to determine if the difference is within tolerance.

Line flagging logic 880 includes any suitable steps, methods, processes and/or software for taking any action based upon the results of the comparison taken by compare line signal coupling coefficients logic 870. For example, in an embodiment, line flagging logic 880 comprises outputting one or both of the determined and threshold coupling coefficients and, optionally, the difference between the two. Optionally, if the determined coupling coefficient is greater than the threshold value, or not within the tolerance, line flagging logic 880 may further flag the target line as having a noteworthy, or possibly deleterious, signal coupling coefficient. Line flagging logic 880 flags the target line segment in any suitable manner. For example, line flagging logic 880 may create a design rule check (a "DRC") as a flag for the target line. The DRC is optionally stored in the circuit design database or outputted to the user. Line flagging logic 880 may optionally indicate any flagged target line directly to the user, may store a list of flagged target lines separately, and/or may indicate the flagged target line to the EDA logic as desired.

It will be appreciated that a target line segment may be flagged if any K factor calculation along the length of the target line segment results in a difference between the threshold and the determined value. Alternatively, the total K factor for the target line segment may be calculated and a flag issued if the total determined factor differs from the threshold value.

Figure 14:
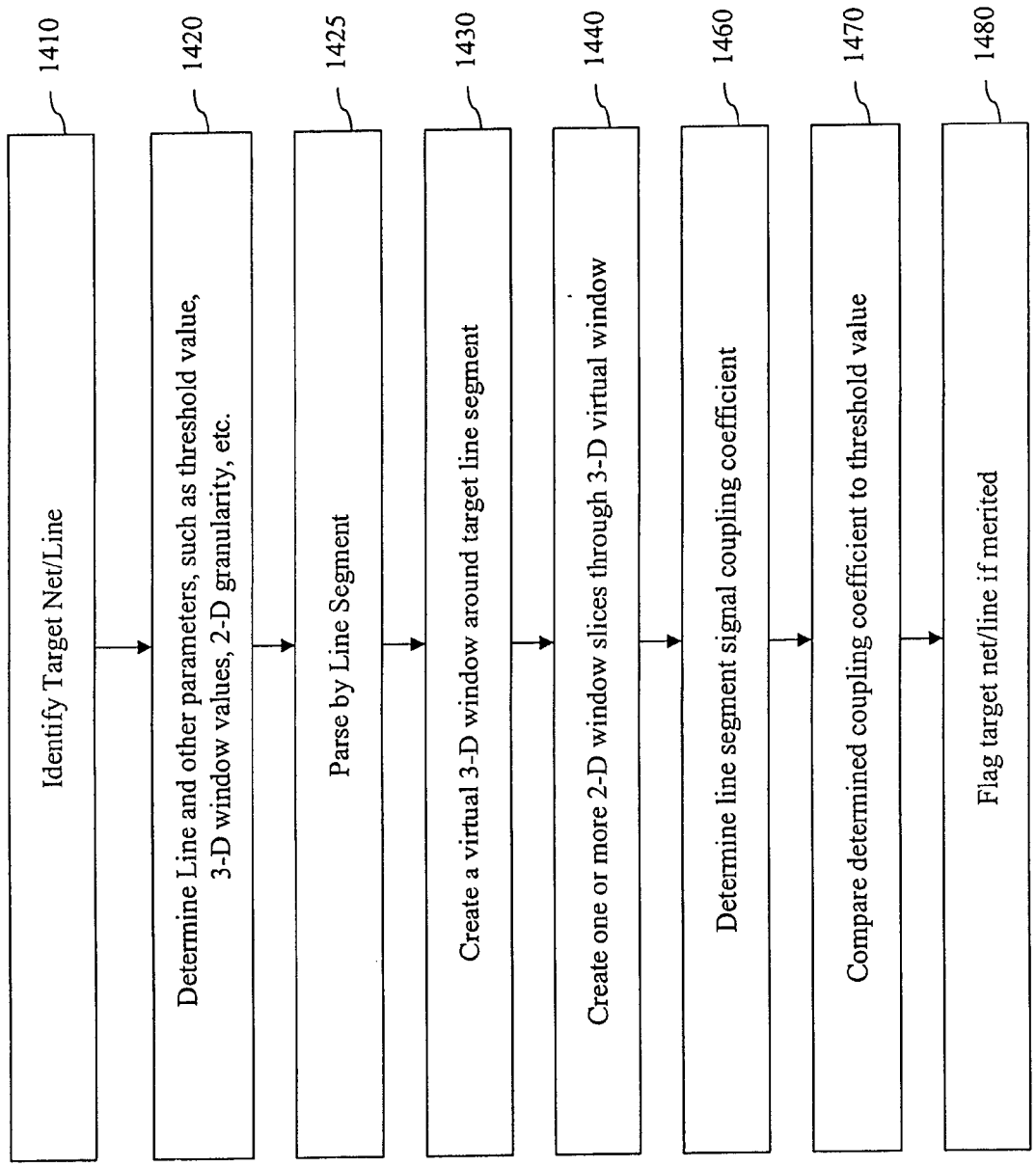
FIG. 14 is a block diagram showing an exemplary methodology for determining a line signal coupling coefficient.

FIG. 14 shows an exemplary methodology for determining signal coupling coefficients for lines. The blocks shown represent functions, actions or events performed therein. If embodied in software, each block may represent a module, segment or portion of code that comprises one or more executable instructions to implement the specified logical function(s). If embodied in hardware, each block may represent one or more circuits or other electronic devices to implement the specified logical function(s). It will be appreciated that computer software applications involve dynamic and flexible processes such that the functions, actions or events performed by the software and/or the hardware can be performed in other sequences different than the one shown.

With further reference to FIG. 14, an exemplary methodology is described. At block 1410, a target line or net is identified by any suitable method, including but not limited to by steps, methods, processes and logic described herein with respect to target net/line identification logic 810. The target line/net is the line or net for which a signal coupling coefficient is to be determined. At block 1420 other parameters related to the determination of the signal coupling coefficient are optionally determined. For example, a threshold value of a signal coupling coefficient is determined, the size and shape of the virtual 3-D window is input, the 2-D window granularity is input, etc. These parameters are input by a user, hard-coded into a tool, or otherwise determined as described herein with respect to line input parameter logic 820. At block 1425 the target line/net is parsed into one or more line segments by any suitable method, including but not limited to by steps, methods, processes and logic described herein with respect to parse by line segment logic 825.

At block 1430 a virtual 3-D window around the target line segment is created by any suitable method, including but not limited to any steps, methods, processes and logic described herein with respect to create virtual 3-D window logic 830. It will be appreciated that all line segments located within the 3-D window are selected and designated as "neighboring" line segments to the target line segment. At block 1440 one or more 2-D window slices through the virtual 3-D window are created by any steps, methods, processes and logic described herein with respect to create 2-D windows logic 840. It will be appreciated that at block 1440 the granularity of the 2-D windows is optionally created by any steps, methods, processes and logic described herein with respect to 2-D window granularity logic 845. It will be further appreciated that block 1440 (and other blocks in FIG. 14) may be repeated iteratively to achieve a desired result.

At block 1460 the signal coupling coefficient of the target line segment to the neighboring line segment(s) is determined by any suitable method, including but not limited to any steps, methods, processes and logic described herein with respect to determine line segment signal coupling coefficient logic 860. For example, the capacitances between and/or among the target line segment and the neighboring line segments are determined and optionally contained in a capacitance matrix. An exemplary signal coupling coefficient is determined by dividing the sum of the capacitances of the mutuals to the target line segment by the sum of the capacitance of the target line segment to ground and the capacitances of the mutual to the target via. It will be appreciated that a signal coupling coefficient may be determined for a single 2-D window of a line segment, of a plurality of 2-D windows, of all 2-D windows in a virtual 3-D window, of all 3-D windows over a line or line segment, over all parts of a line or a net, etc.

At block 1470 the determined signal coupling coefficient of the target line segment is compared to a threshold value, if one has been determined. At block 1480 the target line segment is flagged in any suitable manner if the comparison made at block 1470 indicates that a disparity exists between the determined and threshold value or that the difference between the two is not within a tolerance level. For example, a DRC may be issued if the signal coupling coefficient of a target line segment is greater than the threshold value. The DRC is issued and/or stored by any suitable method; e.g., by placing the DRC in the circuit design database associated with the target line segment. It will be appreciated that a flag may be issued for an inequity in any comparison, such as for a single 2-D window of a line segment, of a plurality of 2-D windows, of all 2-D windows in a virtual 3-D window, of all 3-D windows over a line or line segment, over all parts of a line or a net, etc.

Path Signal Coupling Coefficient Tool

With reference to FIG. 2, the PSCC tool 220 determines the capacitive signal coupling coefficient of an identified path and optionally compares the determined value to one or more other paths or a threshold value. An exemplary output of the PSCC tool 220 is a ranked list (e.g., from least to most) of paths (e.g., nets or buses) ordered by signal coupling coefficient, or a list of all paths in a circuit or substrate which exhibited a signal coupling coefficient greater than or equal to a threshold value. PSCC tool 220 optionally calls either or both VSCC tool and LSCC tool to determine the signal coupling coefficient of one or more paths.

Figure 15:
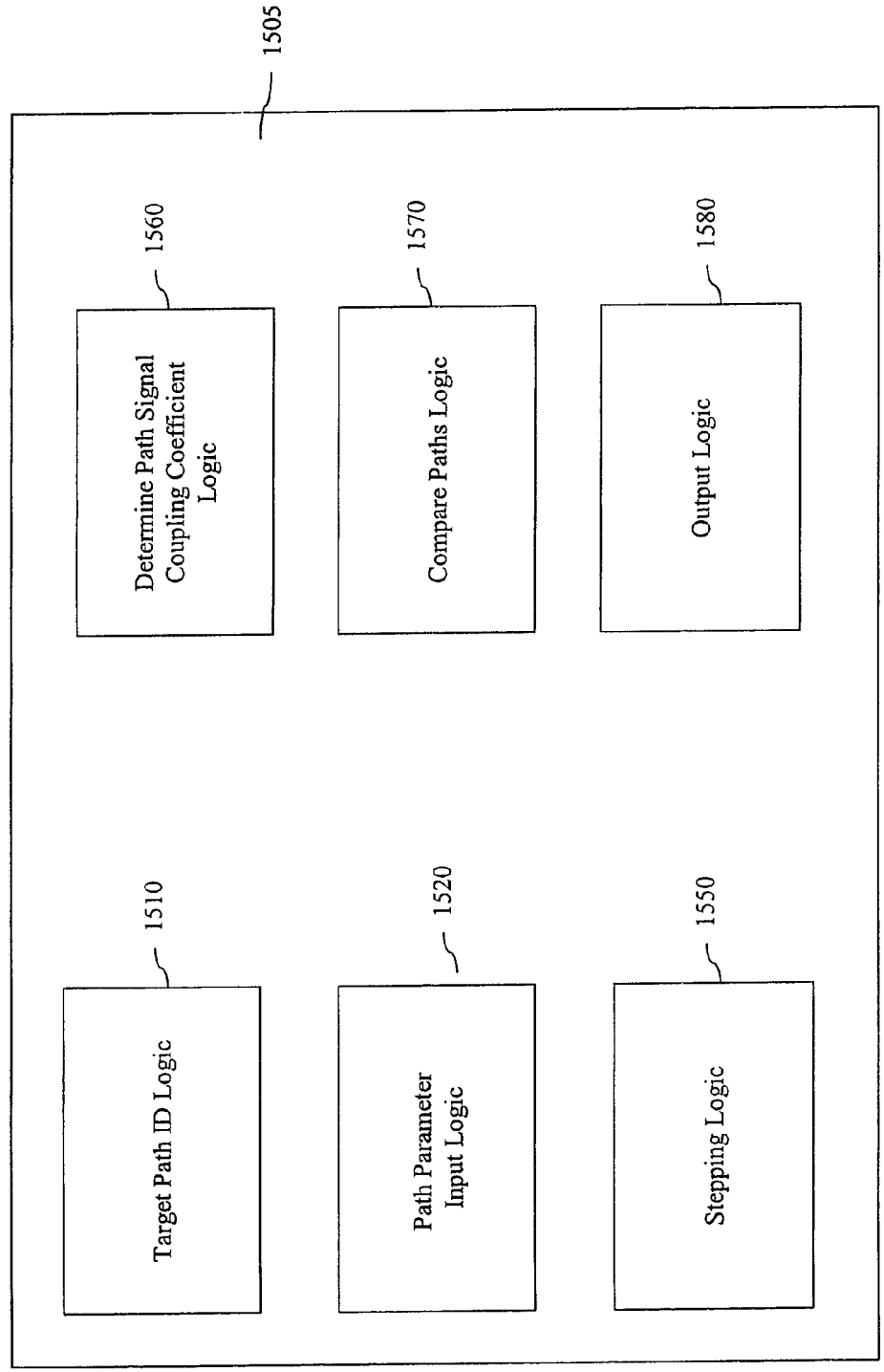
FIG. 15 is an exemplary system diagram of a component of a system for determining a path signal coupling coefficient.

With reference to FIG. 15, PSCC tool 220 includes PSCC logic 1505. PSCC logic 1505 includes any suitable steps, methods, processes and/or software for determining the capacitive signal coupling coefficient of an identified path and optionally comparing the determined value with other signal coupling coefficients of the circuit or a threshold value. As used with the PSCC tool, a "path" is any connected group of at least two connective elements in a circuit or substrate, such as, e.g., a bus or a net. It will be appreciated that the PSCC tool 220 can be applied to any path in a circuit, and is optionally applied to a bus, an entire net, or any other subgroup of connections in the substrate.

In an embodiment, PSCC logic 1505 includes target path identification logic 1510, stepping logic 1550, determine path signal coupling coefficient logic 1560 and, optionally, path parameter input logic 1520, compare paths logic 1570 and output logic 1580.

Target path identification logic 1510 includes any suitable steps, methods, processes and/or software for identifying a path for which a signal coupling coefficient is to be determined. For example, a user inputs the identity of a target net (or bus) or a plurality of target nets. Optionally, a user inputs the identity of each net within a substrate if the coupling coefficients of the substrate are to be determined. It will be appreciated that the identity can be input in any suitable manner.

Path parameter input logic 1520 includes any suitable steps, methods, processes and/or software for receiving or otherwise identifying one or more parameters which may effect the processing of PSCC logic 1505. It will be appreciated that these input parameters may be either input by a user or hard-coded into the tool. It will further be appreciated that the nature and identity of the inputs will depend upon the desired results achieved by the PSCC logic. For example, via parameter inputs may include the identity of other net(s) within a substrate to which the target net is to be compared (as discussed further below), a desired threshold value, a tolerance for the threshold value and the nature of any desired comparison (such as, e.g., find a zone of the path with the highest coupling coefficient).

Stepping logic 1550 includes any suitable steps, methods, processes and/or software for stepping or otherwise parsing through the target path, including identification of each component line and/or via thereof, and for calling either or both VSCC tool 205 and/or LSCC tool 210 to determine the signal coupling coefficient of each such component. In an embodiment, stepping logic 1550 begins processing at the entry point of the target path (e.g., point A) and ends processing at the exit point of the target path (e.g., point B). Stepping logic 1550 parses the path between point A and point B, identifying each via and each line which comprises the target path. For each identified via and/or line, stepping logic 1550 calls the VSCC tool 200 or the LSCC tool 210 (whichever is appropriate) to determine the signal coupling coefficient of the parsed component.

Determine path signal coupling coefficient logic 1560 includes any suitable steps, methods, processes and/or software for determining the signal coupling coefficient of the target path or any part (e.g., zone) thereof. For example, in an embodiment wherein the overall signal coupling coefficient of the target path is desired, determine path signal coupling coefficient logic 1560 aggregates the signal coupling coefficients determined by each call to VSCC tool 200 and/or LSCC tool 210 made by stepping logic 1550 in the parsing of the target path. The total coupling coefficient of the target path is determined in any suitable manner, including by taking the total of the coefficients of each connective element (i.e., each via and line) and the length of the path into account. In another example, one or more zones of a path are desired to be compared. In this example, determine path signal coupling coefficient logic 1560 aggregates the signal coupling coefficients of individual connective elements of the path into one or more zones. Each zone is determined in any suitable manner, such as, e.g., by layer. In yet another example, determine path signal coupling coefficient logic 1560 determines whether a DRC exists for any one or more connective element of a target path.

Compare paths logic 1570 includes any suitable steps, methods, processes and/or software for comparing the signal coupling coefficient of one or more target net(s) with each other and, optionally, a threshold value or other paths as previously input to the PSCC tool. For example, a user desires to compare the signal coupling coefficient of a target path to all other paths of a circuit. Compare paths logic 1570 retrieves the total coupling coefficient of the target path as determined by determine path signal coupling coefficient logic 1570 and compares such to the signal coupling coefficients of all other paths in the circuit (as, e.g., determined individually by separate application of the PSCC tool). Any suitable comparison is determined, such as, e.g., to determine which is greater, which is less, which is above the threshold value, etc. In an additional example, individual zones of a target path are compared to determine which has the highest signal coupling coefficient or to determine which zone has exceeded the threshold value (or has a DRC). In embodiments wherein the total signal coupling coefficient of a plurality of paths is determined, compare paths logic 1570 compares the determined values of each path to determine relationships there between, such as, e.g., which path has the highest coefficient, which path has the lowest, etc.

Output logic 1580 includes any suitable steps, methods, processes and/or software for outputting the results of stepping logic 1550, determine path signal coupling coefficient logic 1560 and/or compare paths logic 1570. For example, a list of nets of a circuit are desired, ordered from best to worst coupling. Output logic 1580 accesses compare paths logic to determine the order of the paths of the circuit and outputs an ordered list of the paths. It will be appreciated that output logic 1580 may output any determination or comparison of stepping logic 1550, determine path signal coupling coefficient logic 1560 and/or compare paths logic 1570.

Figure 16:
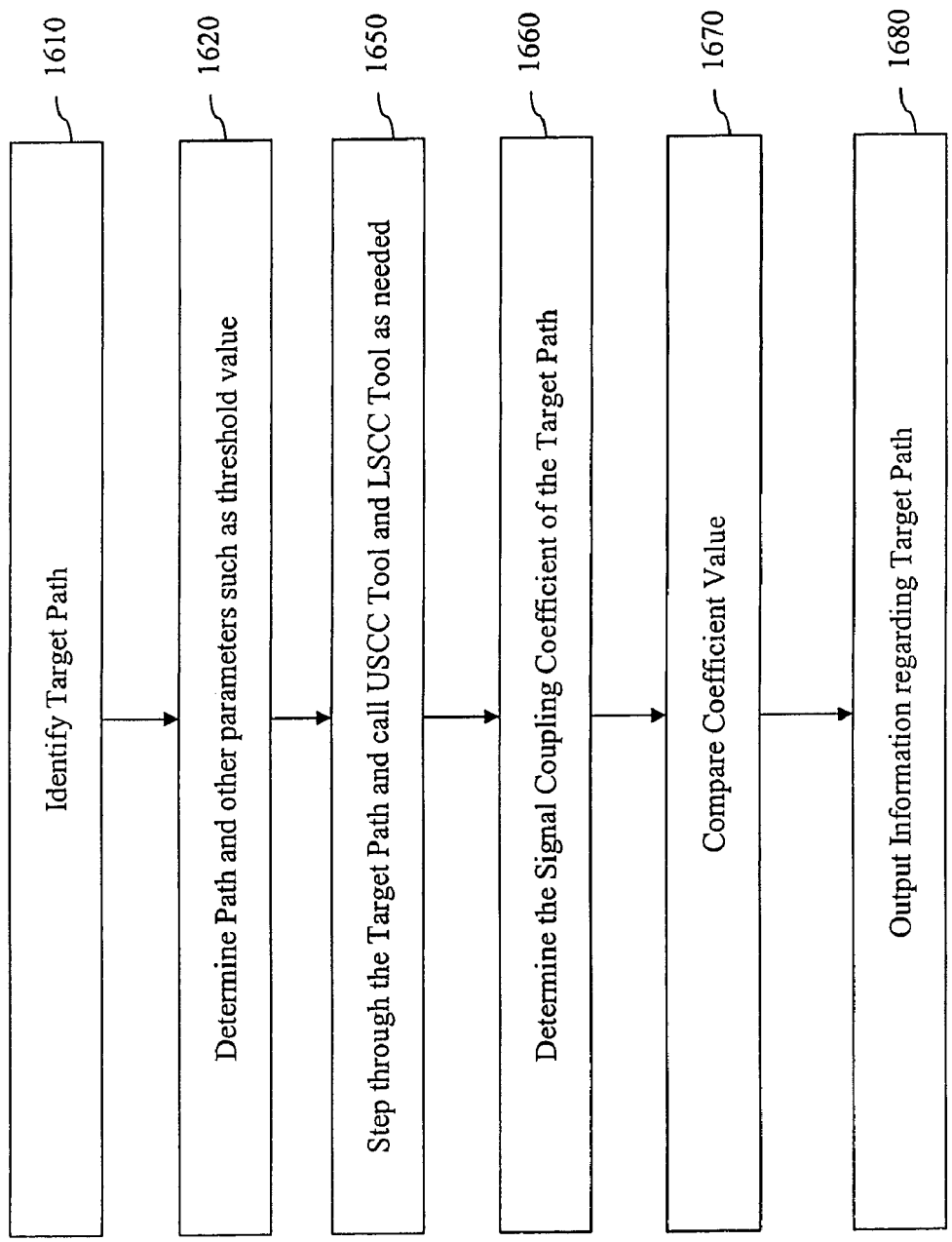
FIG. 16 is a block diagram showing an exemplary methodology for determining a path signal coupling coefficient.

FIG. 16 shows an exemplary methodology for determining signal coupling coefficients for a path. At block 1610, a target path is identified by any suitable method, including but not limited to by steps, methods, processes and logic described herein with respect to target path identification logic 1510. At block 1620 other parameters related to the determination of the signal coupling coefficient are optionally determined, including but not limited to parameters as described herein with respect to path parameter input logic 1520.

At block 1650, the target path is stepped through one connectivity element at a time, calling the VSCC tool and/or the LSCC tool as appropriate, including but not limited to by steps, methods, processes and logic described herein with respect to stepping logic 1550. At block 1660 the signal coupling coefficient of the target path is determined by any suitable method, including but not limited to any steps, methods, processes and logic described herein with respect to determine path signal coupling coefficient logic 1560.

At block 1670, the determined path coupling coefficient is compared to one or mother other paths or a threshold value, including but not limited to by steps, methods, processes and logic described herein with respect to compare paths logic 1570. At block 1680, the information regarding the target path and/or any other path in the substrate is outputted as appropriate, including but not limited to by steps, methods, processes and logic described herein with respect to output logic 1580.

Although the flow charts herein show exemplary orders of execution, it is understood that the order of execution for other embodiments may differ from that which is depicted. Also, two or more blocks shown herein may be combined and/or executed concurrently or with partial concurrence. It is understood that all such variations are within the scope of various embodiments of the present invention. Three such exemplary alternative embodiments are set forth below.

Figure 17:
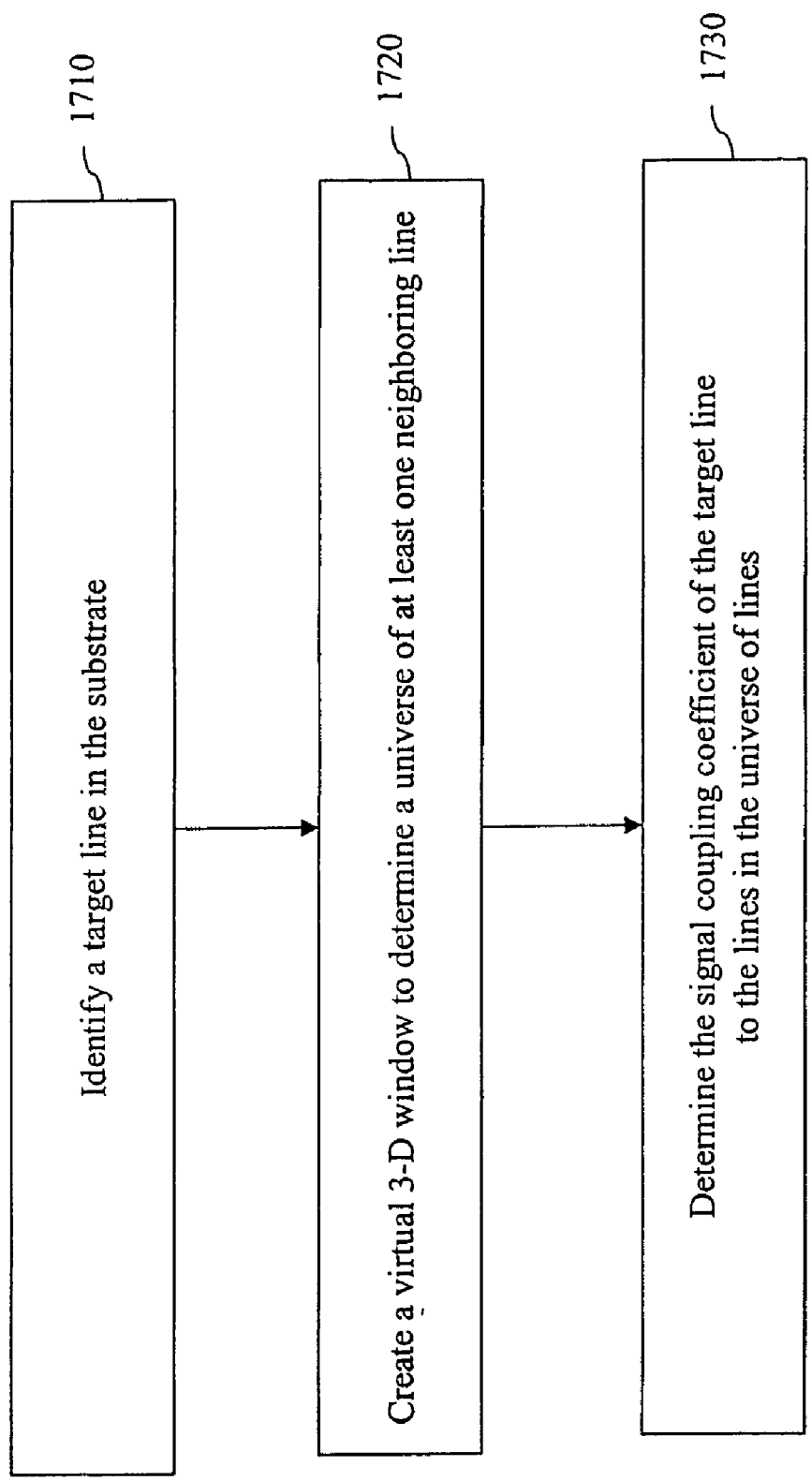
FIG. 17 is a block diagram showing an exemplary methodology for determining a signal coupling coefficient of a line in a substrate represented in a circuit design database.

FIG. 17 shows an exemplary methodology for determining a signal coupling coefficient of a line in a substrate represented in a circuit database. At block 1710, a target line in the substrate for which the signal coupling coefficient is to be determined is identified. At block 1720 a virtual 3-D window is created to determine a universe of at least one neighboring lines. At block 1730 the signal coupling coefficient of the target line to the lines in the universe of lines is determined.

Figure 18:
FIG. 18 is a block diagram showing an exemplary methodology for determining a signal coupling coefficient of a line in a substrate represented in a circuit design database.

FIG. 18 shows an exemplary methodology for determining a signal coupling coefficient of a line in a substrate represented in a circuit design database. At block 1810, a target line in the substrate for which the signal coupling coefficient is to be determined is identified. At block 1820 a threshold value of a signal coupling coefficient is obtained. At block 1830 the target line is parsed into at least one line segment. At block 1840 a virtual 3-D window is created around at least one line segment. At block 1850 at least one 2-D window is created from the 3-D window. At block 1860 the signal coupling coefficient of the line segment to any other line segments in the 2-D window is determined. At block 1870 the determined signal coupling coefficient of the target line segment is compared to the threshold value. At block 1880 the target line is flagged with a design rule check if the threshold value is less than or equal to the determined value.

Figure 19:
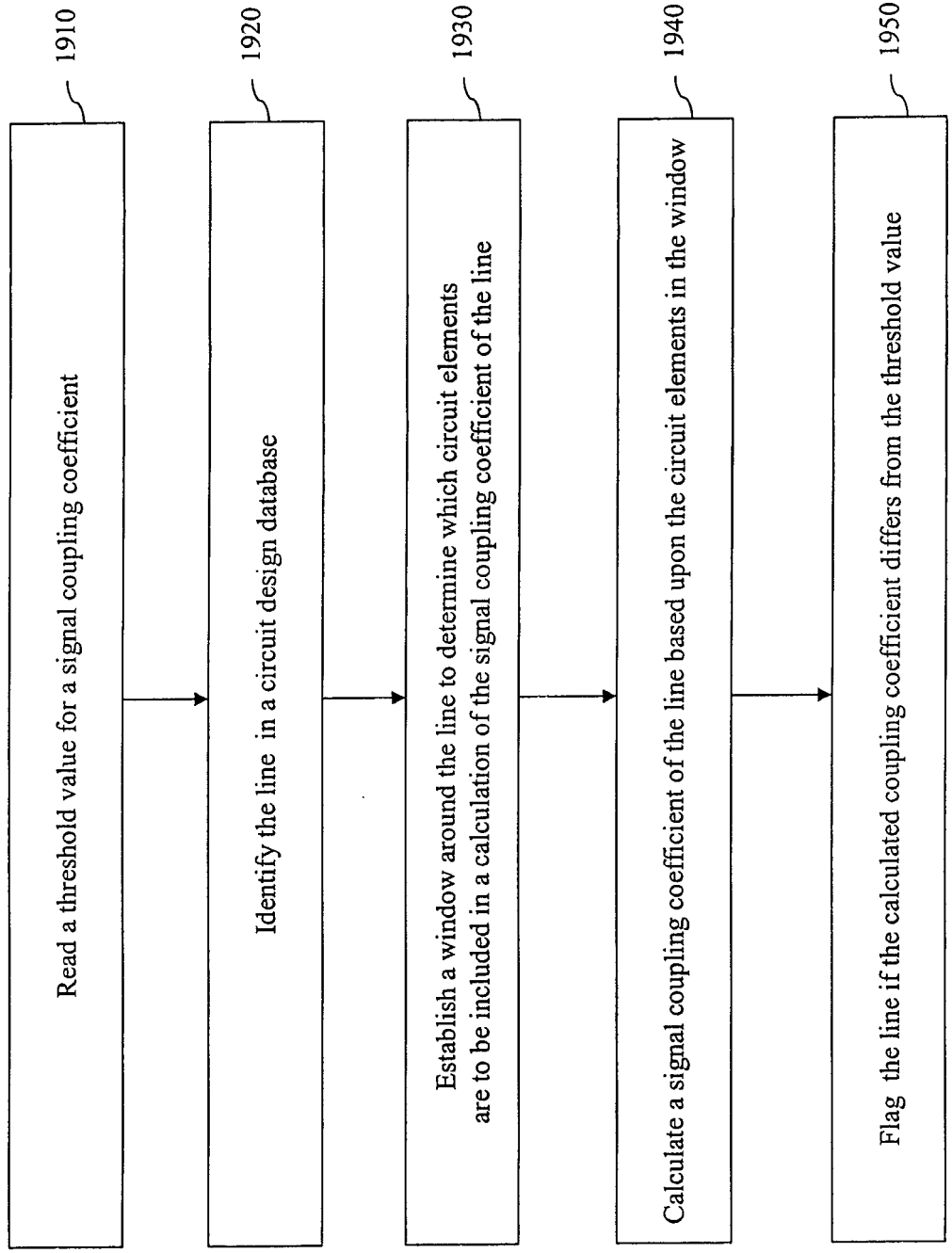
FIG. 19 is a block diagram showing an exemplary methodology for determining a signal coupling coefficient for a line in an electrical circuit layout.

FIG. 19 shows an exemplary methodology for determining a signal coupling coefficient for a line in an electrical circuit layout. At block 1910 a threshold value for a signal coupling coefficient is read. At block 1920 the line is identified in a circuit design database. At block 1930 a window is established around the line to determine which circuit elements are to be included in a calculation of the signal coupling coefficient of the line. At block 1940 a signal coupling coefficient is calculated based upon the circuit elements in the window. At block 1950 the line is flagged if the calculated coupling coefficient differs from the threshold value.

While the present invention has been illustrated by the description of embodiments thereof, and while the embodiments have been described in considerable detail, the scope of the appended claims should not be restricted or in any way limited to such detail. Additional advantages and modifications will readily appear to those skilled in the art. Therefore, the invention, in its broader aspects, is not limited to the specific details, the representative systems, and illustrative examples shown and described. Accordingly, departures may be made from such details without departing from the spirit or scope of the invention disclosed herein.

We claim:

1. A system for determining a signal coupling coefficient of a line in a substrate represented in a circuit design database, the system comprising:
   electronic design automation tool for designing the substrate; and
   line signal coupling coefficient logic for determining the signal coupling coefficient of a target line designed by the electronic design automation tool and contained in the circuit design database, the line signal coupling coefficient logic comprising:
      target net/line identification logic for identifying the target line;
      create virtual 3-D window logic for creating a virtual 3-D window around the target line for determining a universe of at least one neighboring line;
      determine line segment signal coupling coefficient logic for determining the signal coupling coefficient of the target line based on the target line and the neighboring lines;
      logic for creating a capacitive matrix containing capacitance of the target line and each line in the universe of neighboring lines; and
      logic for calculatin a K factor by dividing a sum of capacitance of non-ground lines mutual to the target line by a sum of capacitance of the target line to ground and the sum of the capacitance of the non-ground lines mutual to the target line.

2. The system of claim 1, the line signal coupling coefficient logic further comprising:
   parse by line segment logic for dividing the target line into one or more line segments.

3. The system of claim 1, the line segment coupling coefficient logic further comprising:
   create 2-D window logic for creating at least one 2-D window from the virtual 3-D window, wherein the signal coupling coefficient is determined in the at least one 2-D window.

4. The system of claim 3, the create 2-D window logic further comprising:
   2-D window granularity logic for determining granularity of the 2-D windows from the virtual 3-D window.

5. The system of claim 1, the line signal coupling coefficient logic further comprising:
   line input parameter logic for determining a threshold value of the signal coupling coefficient;
   compare line signal coupling coefficient logic for comparing the determined signal coupling coefficient of the target line to the threshold value; and
   line flagging logic for flagging the target line if the threshold value exceeds the determined signal coupling coefficient.

6. The system of claim 1, the line signal coupling coefficient logic further comprising:
   line input parameter logic for determining a size of the virtual 3-D window.

7. A system for determining a signal coupling coefficient of a line in a substrate, the line and the substrate designed by an electronic design automation tool and represented in a circuit design database communicating with the electronic design automation tool, the system comprising:
   line signal coupling coefficient logic for determining the signal coupling coefficient of a target line, the target line contained within the circuit design database, wherein the line signal coupling coefficient logic includes:
      line input parameter logic for determining a threshold value of the signal coupling coefficient;
      create virtual 3-D window logic for creating a virtual 3-D window around a target line segment of the target line for determining a universe of at least one neighboring line segment;
      parse by line segment logic for dividing the target line into one or more line segments;
      determine line segment signal coupling coefficient logic for determining the signal coupling coefficient of the target line segment based upon the target line segment and the neighboring line segments;
      compare line signal coupling coefficient logic for comparing the determined signal coupling coefficient of the line to the threshold; and
      line flagging logic for flagging the target line if the threshold value exceeds the determined signal coupling coefficient and creating a design rule check if the threshold value exceeds the determined signal coupling coefficient and storing the design rule check in the circuit design database.

8. The system of claim 7, further including create 2-D window logic for creating at least one two dimensional window from the virtual 3-D window.

9. An apparatus for determining a signal coupling coefficient of a line in a substrate design contained in a circuit design database, the apparatus comprising:
   a line signal coupling coefficient tool having:
      line signal coupling coefficient logic for determining the signal coupling coefficient of a target line segment, the target line segment contained within the circuit design database, wherein the line signal coupling coefficient logic includes:
target net/line identification logic for identifying a target line;
line input parameter logic for determining a threshold value of a signal coupling coefficient;
parse by line segment logic for dividing the target line into one or more line segments;
create virtual 3-D window logic creating a virtual 3-D window around the target line segment selected from the target line for determining a universe of at least one neighboring line segment;
create 2-D window logic for creating at least one 2-D window from the virtual 3-D window;
determine line segment signal coupling coefficient logic for determining the signal coupling coefficient of the target line segment based upon the target line segment and the neighboring line segments in at least one 2-D window;
compare line signal coupling coefficients logic for comparing the determined signal coupling coefficient of the target line segment to the threshold value; and
line flagging logic for flagging the target line with a design rule check if the threshold value exceeds the determined signal coupling coefficient and for storing the design rule check in the circuit design database.

10. A method for determining a signal coupling coefficient of a line in a substrate represented in a circuit design database, comprising:
identifying a target line in the substrate for which the signal coupling coefficient is to be determined;
creating a virtual 3-D window to determine a universe of at least one neighboring line;
determining the signal coupling coefficient of the target line to lines in the universe of the neighboring lines;
obtaining a threshold value of a signal coupling coefficient;
comparing the determined signal coupling coefficient of the target line to the threshold value;
flagging the target line if the threshold value is not equal to the determined signal coupling coefficient and
flagging the target line with a design rule check if the determined signal coupling coefficient is greater than the threshold value.

11. The method of claim 10, further comprising:
parsing the target line into at least one line segment and identifying a line segment as a target line segment for determining a signal coupling coefficient of the target line segment.

12. The method of claim 11, further comprising:
creating at least one 2-D window from the virtual 3-D window and determining the signal coupling coefficient of the target line segment in a 2-D window.

13. The method of claim 11, the determining the signal coupling coefficient of the target line segment step further comprising:
submitting the target line segment and each line segment in the universe of neighboring lines to an electromagnetic solver.

14. The method of claim 11, the determining the signal coupling coefficient of the target line segment step further comprising:
creating a capacitive matrix containing capacitance of the target line segment and each lines in the universe of neighboring line segments; and
calculating a K factor by dividing a sum of the capacitance of the non-ground line segments mutual to the target line segment by a sum of the capacitance of the target line segment to ground and the sum of the capacitance of the non-ground line segments mutual to the target line segment.

15. The method of claim 10, further comprising:
obtaining a size for the virtual 3-D window and creating the virtual 3-D window.

16. A method for determining a signal coupling coefficient of a line in a substrate represented in a circuit design database, comprising:
identifying a target line in the substrate for which the signal coupling coefficient is to be determined;
obtaining a threshold value of a signal coupling coefficient;
parsing the target line into at least one line segment;
creating a virtual 3-D window around at least one line segment;
creating at least one 2-D window from the virtual 3-D window;
determining the signal coupling coefficient of the line segment to any other line segments in at least one 2-D window;
comparing the determined signal coupling coefficient of the target line segment to the threshold value;
flagging the target line with a design rule check if the threshold value is less than or equal to the determined signal coupling coefficient; and
storing the design rule check in the circuit design database.

17. A computer-implemented method for determining a signal coupling coefficient for a line in an electrical circuit layout, comprising:
reading a threshold value for a signal coupling coefficient;
identifying the line in a circuit design database;
establishing a window around the line in which circuit elements will be included in a calculation of the signal coupling coefficient of the line;
calculating the signal coupling coefficient of the line based upon the circuit elements in the window;
flagging the line if the calculated signal coupling coefficient differs from the threshold value; and
flagging the line with a design rule check if the threshold value exceeds the calculated signal coupling coefficient and storing the design rule check in the circuit design database.

18. A system for determining a signal coupling coefficient of a line in a substrate represented in a circuit design database, the system comprising:
line signal coupling coefficient means for determining the signal coupling coefficient of a target line contained in the circuit design database, the line signal coupling coefficient means comprising:
line input parameter means for determining a threshold value of the signal coupling coefficient;
create 3-D window means for creating a virtual 3-D window around a target line segment of the target line for determining a universe of at least one neighboring line segment;
create 2-D window means for creating at least one 2-D window from the virtual 3-D window;
parse by line segment means for dividing the target line into one or more line segments;

determine line segment signal coupling coefficient means for determining the signal coupling coefficient of the target line segment based upon the target line segment and the neighboring line segments;

compare line signal coupling coefficients means for comparing the determined signal coupling coefficient of the target line segment to the threshold value; and line flagging means for flagging the target line with a design rule check if the threshold value exceeds the determined signal coupling coefficient and means for storing the design rule check in the circuit design database.

\* \* \* \* \*

UNITED STATES PATENT AND TRADEMARK OFFICE
CERTIFICATE OF CORRECTION

PATENT NO.         : 7,137,088 B2
APPLICATION NO.    : 10/838905
DATED              : November 14, 2006
INVENTOR(S)        : Mark D. Frank et al.

It is certified that error appears in the above-identified patent and that said Letters Patent is hereby corrected as shown below:

On the Title page, Item (75), under "Inventors", in column 1, line 3, delete "Kari Bois" and insert -- Karl Bois --, therefor.

In column 21, line 54, in Claim 1, after "based" delete "on" and insert -- upon --, therefor.

In column 21, line 59, in Claim 1, delete "calculatin" and insert -- calculating --, therefor.

In column 22, line 51, in Claim 7, delete "threshold;" and insert -- threshold value; --, therefor.

In column 23, line 9, in Claim 9, after "logic" insert -- for --.

In column 23, line 66, in Claim 14, delete "lines" and insert -- line segment --, therefor.

In column 23, line 67, in Claim 14, delete "line segments" and insert -- lines --, therefor.

In column 24, line 67, in Claim 18, delete "segments:" and insert -- segments; --, therefor.

Signed and Sealed this

Ninth Day of December, 2008

JON W. DUDAS
*Director of the United States Patent and Trademark Office*